US009659818B1

(12) United States Patent
Clevenger et al.

(10) Patent No.: US 9,659,818 B1
(45) Date of Patent: May 23, 2017

(54) FORMING SELF-ALIGNED DUAL PATTERNING MANDREL AND NON-MANDREL INTERCONNECTS

(71) Applicant: INTERNATIONAL BUSINESS MACHINES CORPORATION, Armonk, NY (US)

(72) Inventors: Lawrence A. Clevenger, Rhinebeck, NY (US); Carl Radens, LaGrangeville, NY (US); John Zhang, Altamont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/336,859

(22) Filed: Oct. 28, 2016

(51) Int. Cl.
| H01L 21/311 | (2006.01) |
| H01L 21/768 | (2006.01) |
| H01L 29/66 | (2006.01) |
| H01L 21/033 | (2006.01) |

(52) U.S. Cl.
CPC .... *H01L 21/76883* (2013.01); *H01L 21/0337* (2013.01); *H01L 21/76852* (2013.01); *H01L 21/76897* (2013.01); *H01L 29/6653* (2013.01); *H01L 29/6656* (2013.01)

(58) Field of Classification Search
CPC ........ H01L 21/0334–21/0338; H01L 21/3086; H01L 21/76883; H01L 21/76852; H01L 21/76897; H01L 29/6653; H01L 29/6656
See application file for complete search history.

(56) References Cited

U.S. PATENT DOCUMENTS

| 5,795,830 | A | * | 8/1998 | Cronin | ............... H01L 21/0338 257/E21.036 |
| 7,208,379 | B2 | * | 4/2007 | Venugopal | ........ H01L 21/28123 257/347 |
| 8,921,225 | B2 | | 12/2014 | Yuan et al. | |
| 8,954,913 | B1 | | 2/2015 | Yuan et al. | |
| 8,966,412 | B1 | | 2/2015 | Yuan et al. | |
| 9,147,653 | B2 | | 9/2015 | Yuan et al. | |
| 9,209,076 | B2 | | 12/2015 | Yao et al. | |
| 9,324,722 | B1 | | 4/2016 | Woo et al. | |
| 2014/0225270 | A1 | | 8/2014 | Yuan et al. | |
| 2015/0028489 | A1 | | 1/2015 | Yuan et al. | |
| 2015/0113484 | A1 | | 4/2015 | Yuan et al. | |
| 2016/0079063 | A1 | | 3/2016 | Lee et al. | |
| 2016/0117432 | A1 | | 4/2016 | Yuan et al. | |

* cited by examiner

*Primary Examiner* — Eric Ward
(74) *Attorney, Agent, or Firm* — Cantor Colburn LLP; David Quinn

(57) ABSTRACT

A method for forming conductive lines on a substrate includes depositing a layer of mandrel material on a substrate and removing portions of the layer of mandrel material to form a first mandrel having a first length, a portion of the first mandrel has sloped sidewalls, a second mandrel having a second length, the second mandrel having an outwardly facing sloped sidewall, and a third mandrel having the second length, the third mandrel having an outwardly facing sloped sidewall, the first length is greater than the second length, the first mandrel is arranged between the second mandrel and the third mandrel. A spacer is formed along non-sloped sidewalls of the first mandrel, the second mandrel, and the third mandrel. The first mandrel, the second mandrel, and the third, mandrel, and exposed portions of the substrate are removed to form cavities. The cavities are filled with a conductive material.

20 Claims, 53 Drawing Sheets

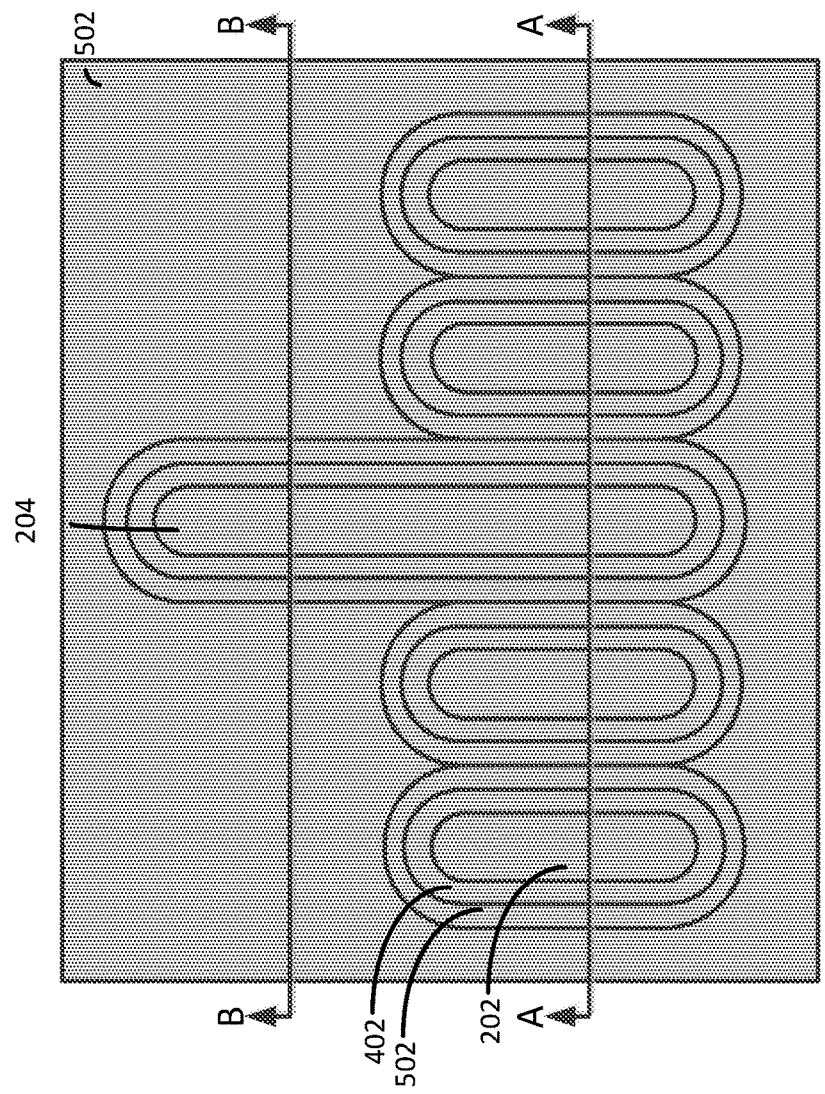

FORMING SELF-ALIGNED DUAL PATTERNING MANDREL AND NON-MANDREL INTERCONNECTS

BACKGROUND

The present invention generally relates to complimentary metal-oxide semiconductors (CMOS) and metal-oxide-semiconductor field-effect transistors (MOSFET), and more specifically relates to conductive lines used in semiconductor devices.

The MOSFET is a transistor used for switching electronic signals. The MOSFET has a source, a drain, and a gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are largely determined by the wavelength of the irradiation.

SUMMARY

According to an embodiment of the present invention, a method for forming conductive lines includes depositing a layer of mandrel material on a substrate and removing portions of the layer of mandrel material to form a first mandrel having a first length and a second mandrel having a second length, the first length is greater than the second length. A first spacer is formed with a first spacer material along sidewalls of the first mandrel and the second mandrel, the first spacer defining a gap between the first mandrel and the second mandrel. A layer of a second spacer material is deposited over the first spacer, the substrate, the gap, and the first mandrel and the second mandrel. Portions of the second spacer material are removed to expose portions of the first mandrel, the second mandrel, and the first spacer, and form a second spacer in the gap. The first mandrel and the second mandrel to expose portions of the substrate, and exposed portions of the substrate are removed to form cavities. The first spacer and the second spacer are removed, and the cavities are filled with a conductive material.

According to another embodiment of the present invention, A method for forming conductive lines on a substrate includes depositing a layer of mandrel material on a substrate and removing portions of the layer of mandrel material to form a first mandrel having a first length, a portion of the first mandrel has sloped sidewalls, a second mandrel having a second length, the second mandrel having an outwardly facing sloped sidewall, and a third mandrel having the second length, the third mandrel having an outwardly facing sloped sidewall, the first length is greater than the second length, the first mandrel is arranged between the second mandrel and the third mandrel. A spacer is formed along non-sloped sidewalls of the first mandrel, the second mandrel, and the third mandrel. The first mandrel, the second mandrel, and the third, mandrel, and exposed portions of the substrate are removed to form cavities. The cavities are filled with a conductive material.

According to yet another embodiment of the present invention, a method for forming conductive lines on a substrate includes depositing a layer of conductive material on a substrate, and removing portions of the layer of conductive material to form a first mandrel having a first length and a second mandrel having a second length, the first length is greater than the second length. A first spacer is formed with a first spacer material along sidewalls of the first mandrel and the second mandrel, the first spacer defining a gap between the first mandrel and the second mandrel. A layer of a second spacer material is deposited over the first spacer, the substrate, the gap, and the first mandrel and the second mandrel. Portions of the second spacer material are removed to expose portions of the first mandrel, the second mandrel, and the first spacer, and form a second spacer in the gap. A second layer of conductive material is deposited over the substrate, and portions of the second layer of conductive material are removed to expose portions of the first spacer and the second spacer. The first spacer and the second spacer are removed to expose portions of the substrate. A fill material is deposited on exposed portions of the substrate.

BRIEF DESCRIPTION OF THE DRAWINGS

FIGS. 1-12C illustrate an exemplary embodiment of a method for forming conductive lines for a semiconductor device.

FIG. 1 illustrates a side view of a substrate and a mandrel layer arranged on the substrate.

FIG. 5C illustrates a top view following the deposition of a second layer of spacer material over the mandrels, the substrate and the spacers.

FIG. 12C illustrates a top view following the formation of conductive lines.

FIGS. 13-24C illustrate another exemplary embodiment of a method for forming conductive lines for a semiconductor device.

FIG. 13 illustrates a side view of the substrate and a layer of conductive material arranged on the substrate.

FIG. 24C illustrates a top view following a planarization process that removes portions of the layer of fill material to expose the conductive lines and form fill regions.

FIGS. 25-29 illustrate another exemplary method for forming conductive lines for a semiconductor device.

FIG. 25 illustrates a side view of a substrate and a mandrel layer arranged on the substrate.

FIG. 29 illustrates a top view of the resultant structure.

DETAILED DESCRIPTION

Conductive connections in semiconductor devices and integrated circuits often include conductive lines that are arranged in trenches formed in an insulating material. The conductive lines connect to devices in the circuit. Integrated circuits often have multiple layers of devices and conductive lines arranged on one or more wafers. Conductive vias are used to form electrical connections between different layers of an integrated circuit.

As the scale of semiconductor devices continues to decrease, aligning and patterning conductive lines in desired locations on the chip continues to become more challenging. Typically, in an integrated circuit having trenches filled with conductive material to form conductive lines, it is desirable to pattern the trenches using a self-alignment method to avoid misalignments. As the pitch of the trenches or lines scales down, the use of previous patterning methods has not resulted in a desired trench alignment and often use additional mask patterning processes that are costly and time consuming.

The embodiments described herein provide for a method for patterning that distinguishes mandrel lines and non-mandrel lines on device during the formation of the conductive lines.

FIGS. 1-12C illustrate an exemplary embodiment of a method for forming conductive lines for a semiconductor device.

Figure 1:
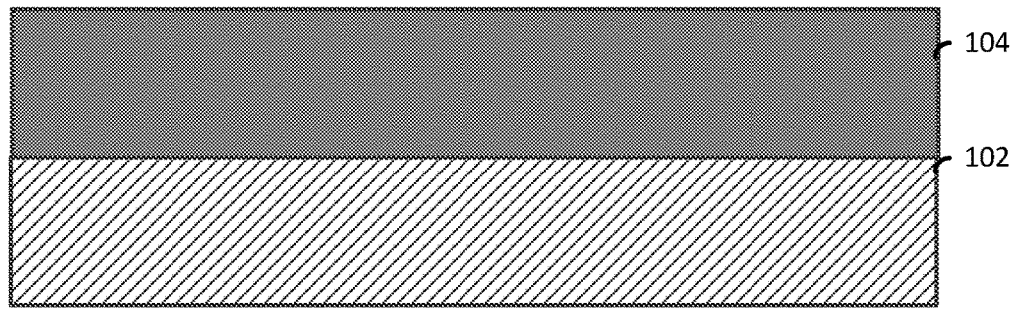

FIG. 1 illustrates a side view of a substrate 102 and a mandrel layer 104 arranged on the substrate 102. The substrate 102 can include any suitable semiconductor material. In some exemplary embodiment, the substrate 102 can include an insulator material such as an oxide or another dielectric material. The methods described herein can be performed using a substrate 102 or an inter-level layer that can be formed above a substrate. The mandrel layer 104 can include, for example, an amorphous silicon material.

Non-limiting examples of suitable materials for the substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 2A:
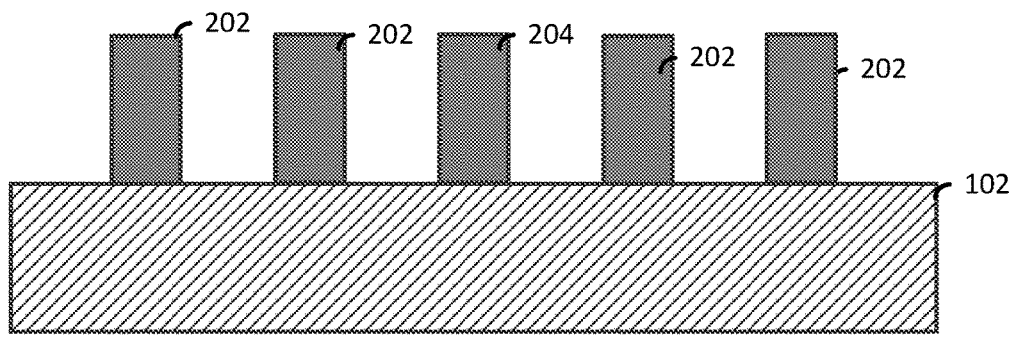
FIG. 2A illustrates a cut-away view along the line A-A (of FIG. 2C)
Figure 2B:
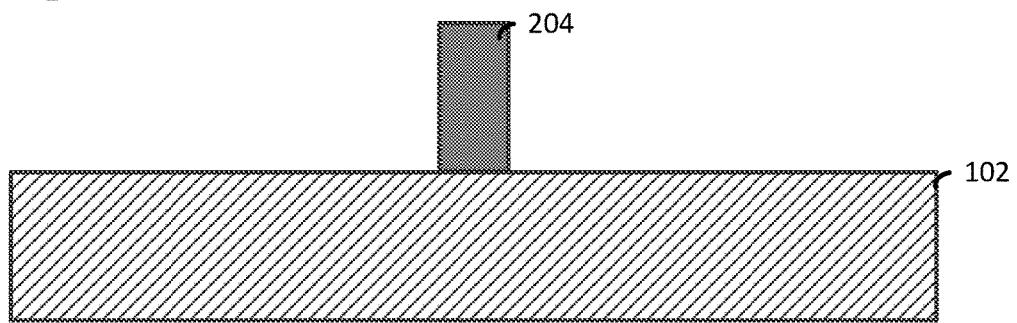
FIG. 2B illustrates a cut-away view along the line B-B (of FIG. 2C)
Figure 2C:
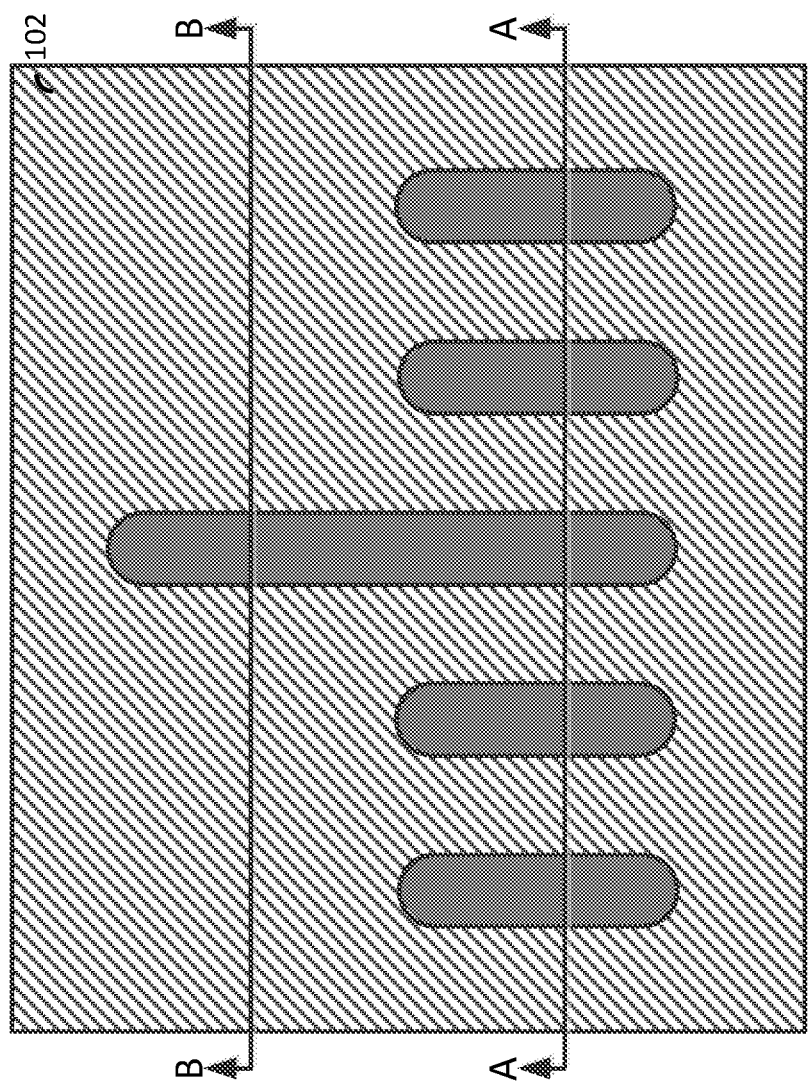
FIG. 2C illustrates a top view following a patterning process that removes portions of the mandrel layer (of FIG. 1) to expose portions of the substrate and form mandrels.

FIG. 2A illustrates a cut-away view along the line A-A (of FIG. 2C), FIG. 2B illustrates a cut-away view along the line B-B (of FIG. 2C), and FIG. 2C illustrates a top view following a patterning process that removes portions of the mandrel layer 104 (of FIG. 1) to expose portions of the substrate 102 and form mandrels 202 and 204. Any suitable etching process can be used to pattern the mandrels 202 and 204 such as, for example, reactive ion etching.

Figure 3A:
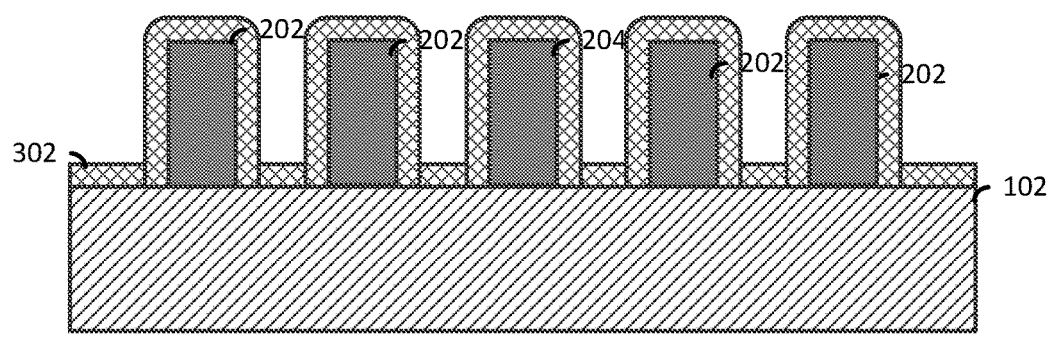
FIG. 3A illustrates a cut-away view along the line A-A (of FIG. 3C)
Figure 3B:
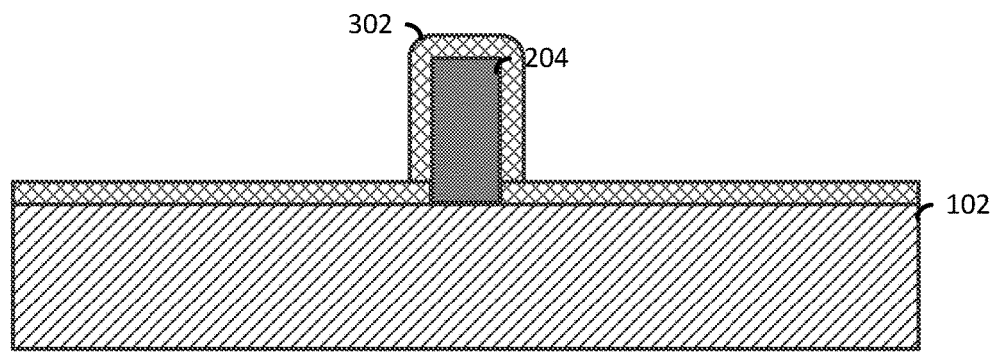
FIG. 3B illustrates a cut-away view along the line B-B (of FIG. 3C)
Figure 3C:
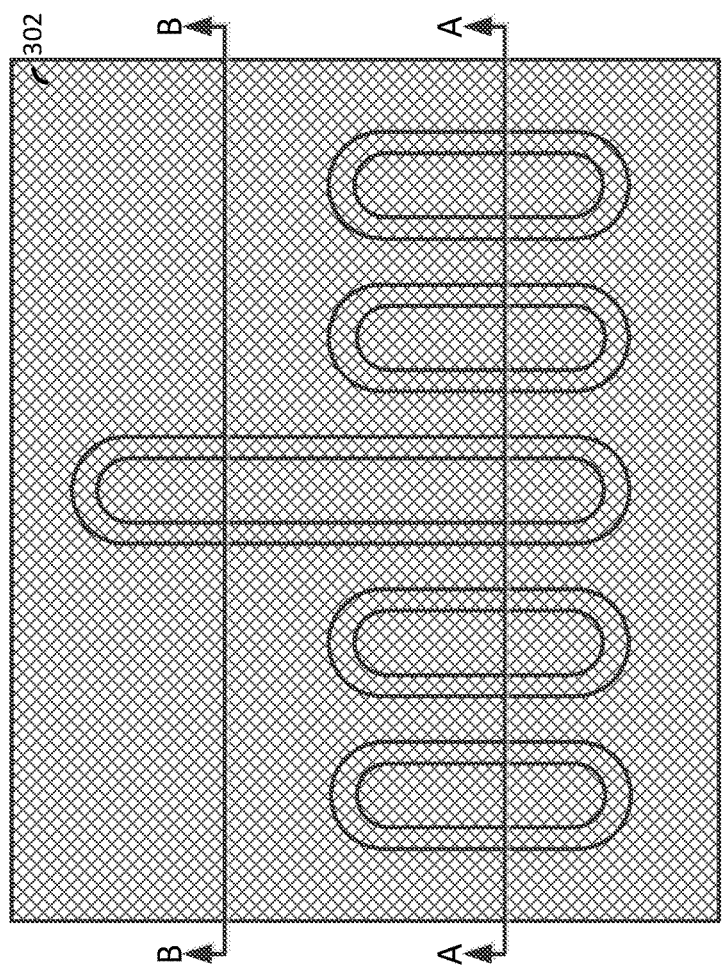
FIG. 3C illustrates a top view following the deposition of a first layer of spacer material.

FIG. 3A illustrates a cut-away view along the line A-A (of FIG. 3C), FIG. 3B illustrates a cut-away view along the line B-B (of FIG. 3C), and FIG. 3C illustrates a top view following the deposition of a first layer of spacer material 302. Non-limiting examples of suitable materials for the layer of spacer material 302 include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Figure 4A:
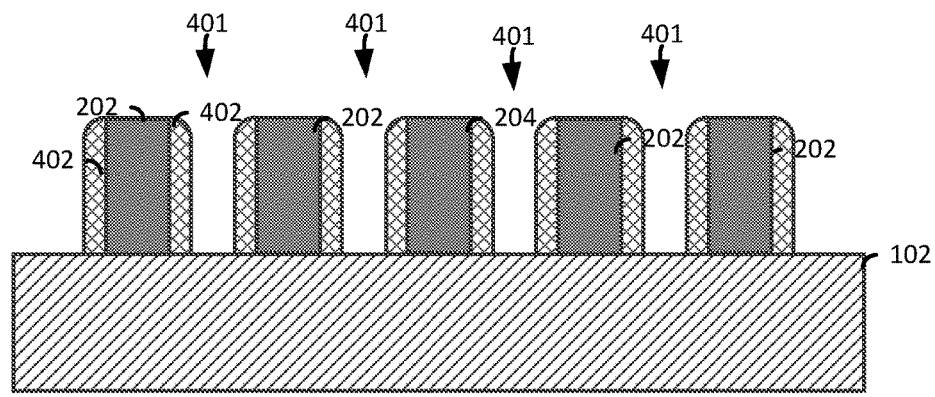
FIG. 4A illustrates a cut-away view along the line A-A (of FIG. 4C)
Figure 4B:
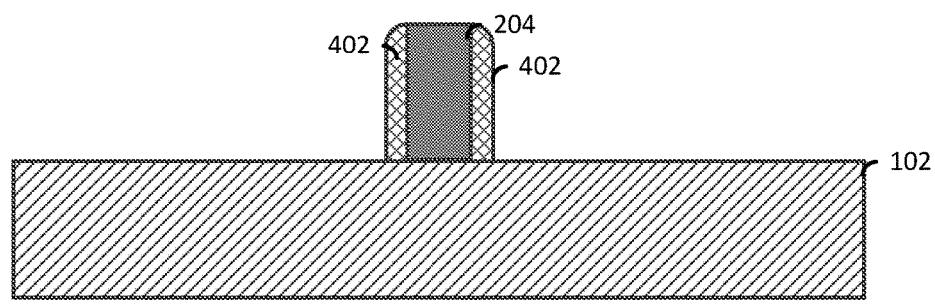
FIG. 4B illustrates a cut-away view along the line B-B (of FIG. 4C)
Figure 4C:
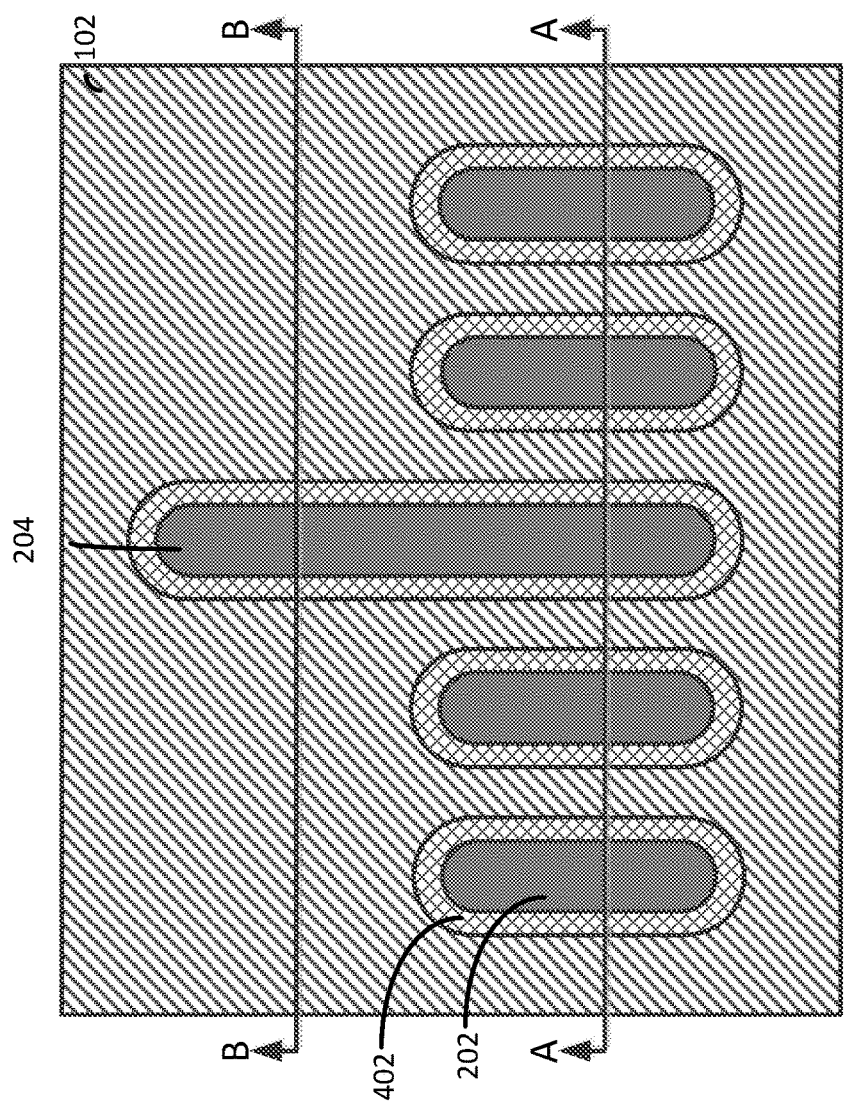
FIG. 4C illustrates a top view following the removal of portions of the layer of spacer material (of FIGS. 3A, 3B, and 3C) to form first spacers.

FIG. 4A illustrates a cut-away view along the line A-A (of FIG. 4C), FIG. 4B illustrates a cut-away view along the line B-B (of FIG. 4C), and FIG. 4C illustrates a top view following the removal of portions of the layer of spacer material 302 (of FIGS. 3A, 3B, and 3C) to form first spacers 402. The first spacers 402 are formed following the deposition of the layer of spacer material, using a suitable anisotropic etching process such as, for example, a reactive ion etching process that is performed to remove portions of the layer of spacer material and form the spacers 402. The first spacers 402 form gaps 401 between adjacent mandrels 202.

Figure 5A:
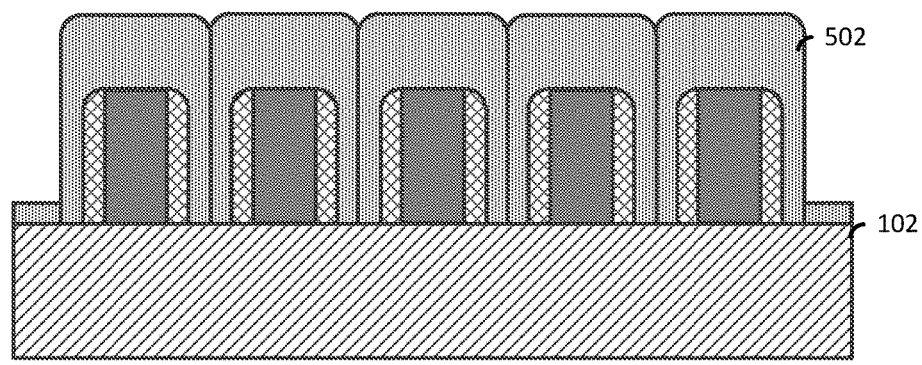
FIG. 5A illustrates a cut-away view along the line A-A (of FIG. 5C)
Figure 5B:
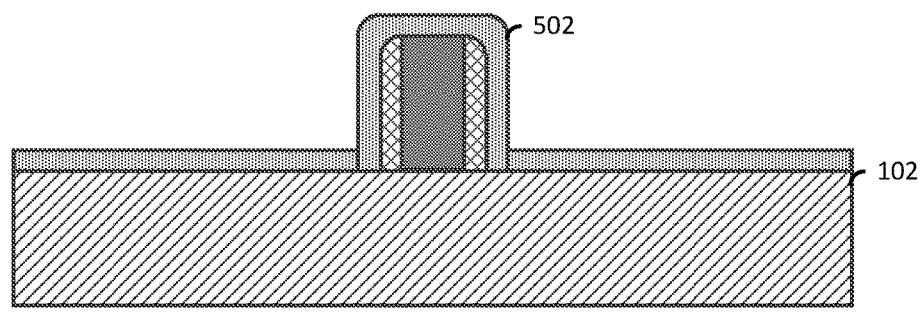
FIG. 5B illustrates a cut-away view along the line B-B (of FIG. 5C)

FIG. 5A illustrates a cut-away view along the line A-A (of FIG. 5C), FIG. 5B illustrates a cut-away view along the line B-B (of FIG. 5C), and FIG. 5C illustrates a top view following the deposition of a second layer of spacer material 502 over the mandrels 202 and 204, the substrate 102 and the spacers 402. The second layer of spacer material 502 can include any suitable spacer material that can be selectively etched with respect to the material of the first spacers 402.

Figure 6A:
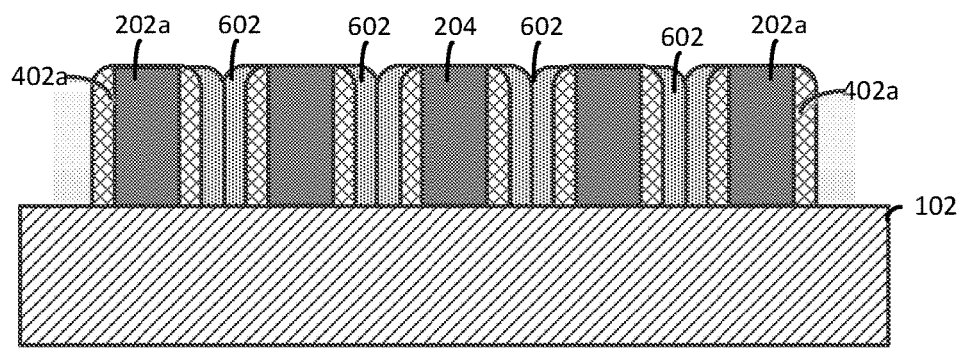
FIG. 6A illustrates a cut-away view along the line A-A (of FIG. 6C)
Figure 6B:
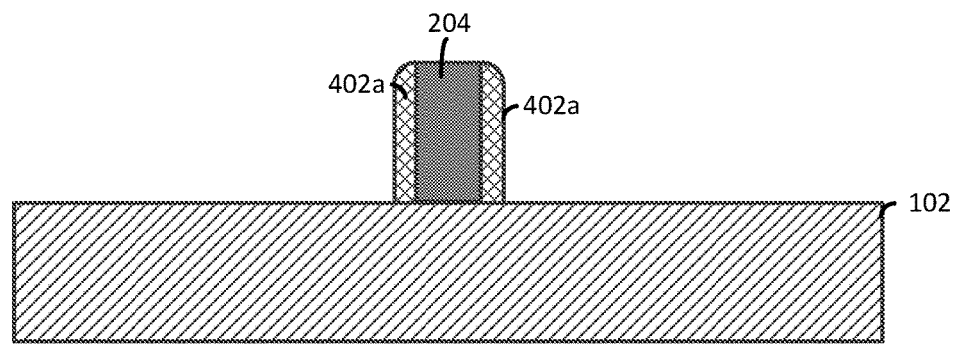
FIG. 6B illustrates a cut-away view along the line B-B (of FIG. 6C)
Figure 6C:
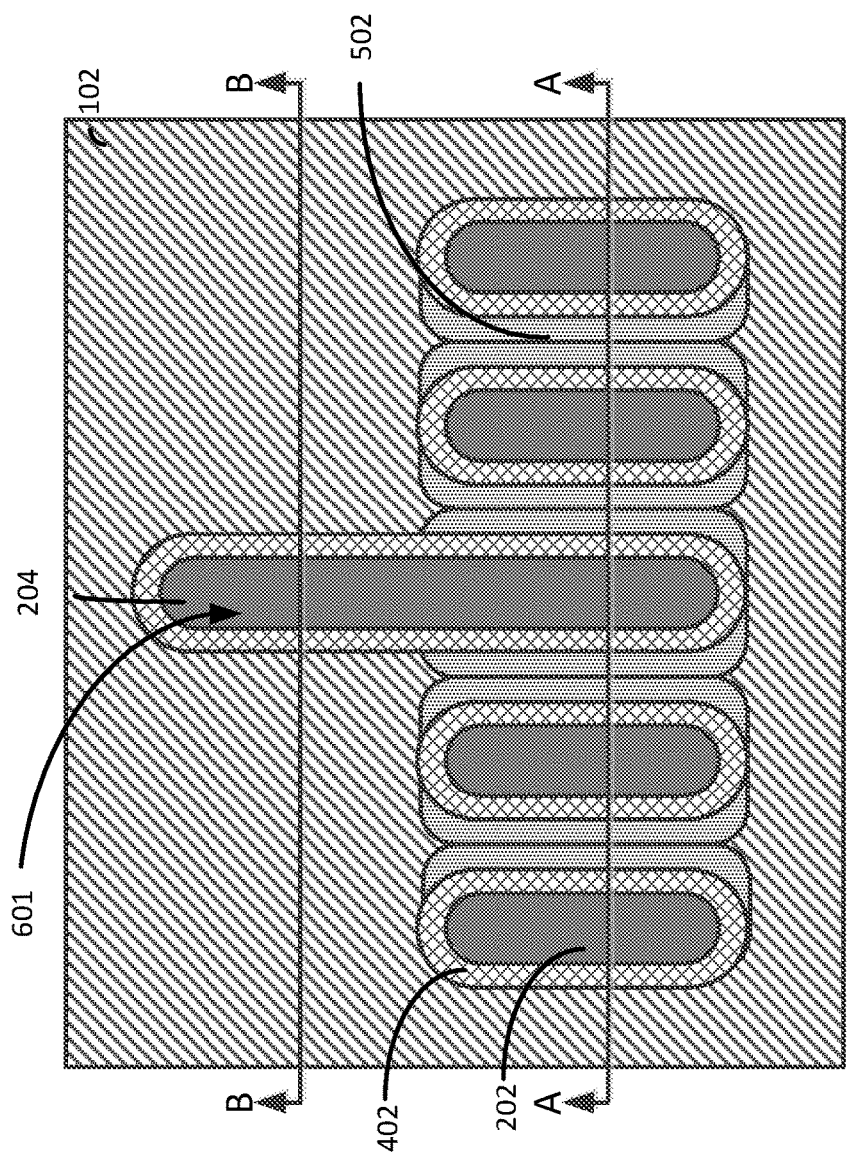
FIG. 6C illustrates a top view following an etching process that removes portions of the second layer of spacer material to form second spacers.

FIG. 6A illustrates a cut-away view along the line A-A (of FIG. 6C), FIG. 6B illustrates a cut-away view along the line B-B (of FIG. 6C), and FIG. 6C illustrates a top view following an etching process that removes portions of the second layer of spacer material 502 to form second spacers 602. The gaps 401 (of FIG. 4A) between the first spacers 402 are filled by the second spacers 602. The outer most mandrels 202a each have a first spacer 402 that is exposed such there is no gap filled by the second layer of spacer material 502 adjacent to the outer spacers along the mandrels 202a. The mandrel 204 has an extended portion 601 that is also not arranged adjacent to other mandrels 202, the spacers 402 along extended portion 601 of the mandrel 204 is also exposed following the etching of the second layer of spacer material 502.

Figure 7A:
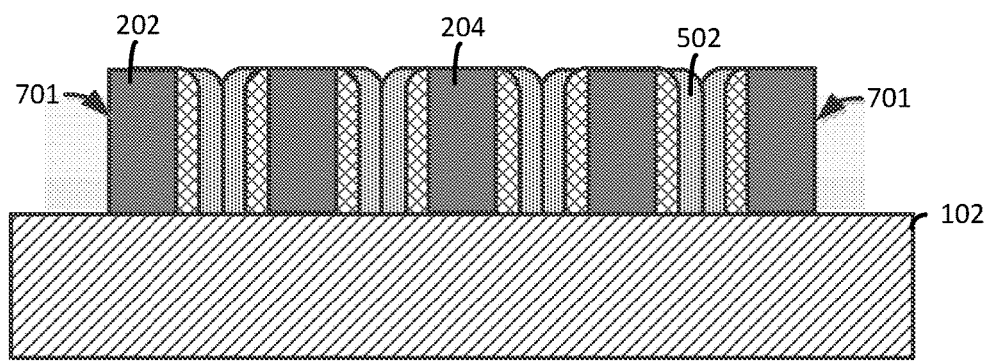
FIG. 7A illustrates a cut-away view along the line A-A (of FIG. 7C)
Figure 7B:
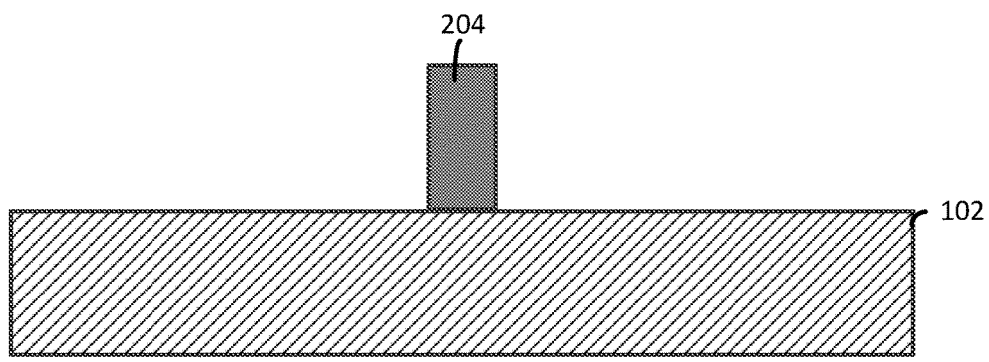
FIG. 7B illustrates a cut-away view along the line B-B (of FIG. 7C)
Figure 7C:
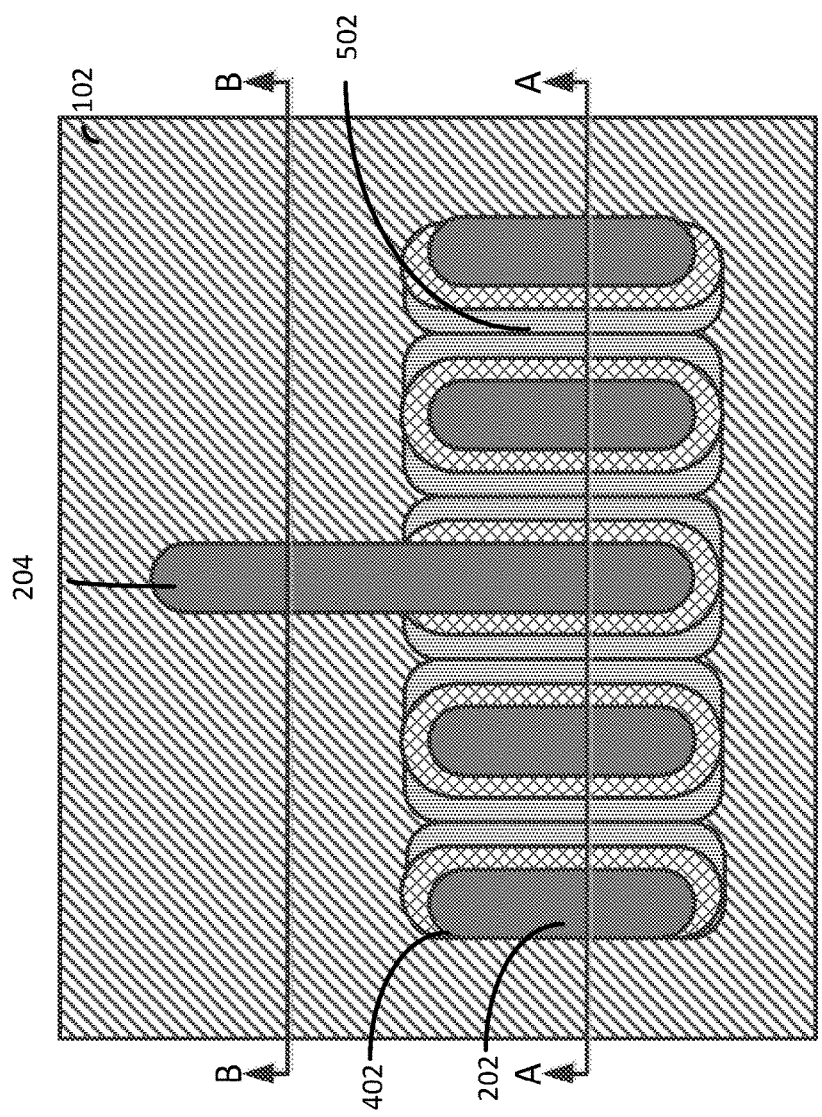
FIG. 7C illustrates a top view following the removal of the exposed first spacers.

FIG. 7A illustrates a cut-away view along the line A-A (of FIG. 7C), FIG. 7B illustrates a cut-away view along the line B-B (of FIG. 7C), and FIG. 7C illustrates a top view following the removal of the exposed first spacers 402a. The exposed first spacers 402a are removed using a selective etching process, such as, for example, reactive ion etching that removes exposed portions of the first spacers 402a. (of FIGS. 6A and 6B).

Figure 8A:
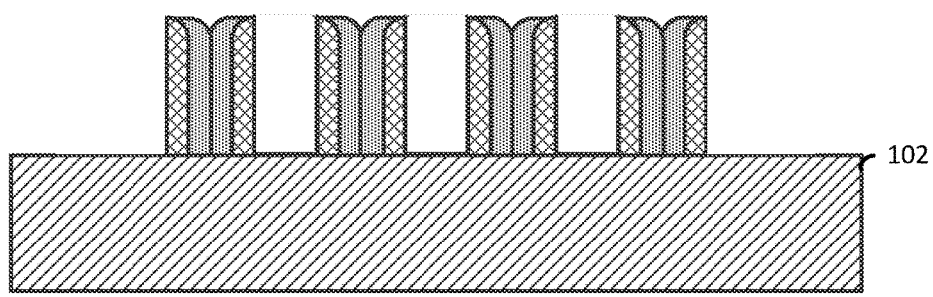
FIG. 8A illustrates a cut-away view along the line A-A (of FIG. 8C)
Figure 8B:
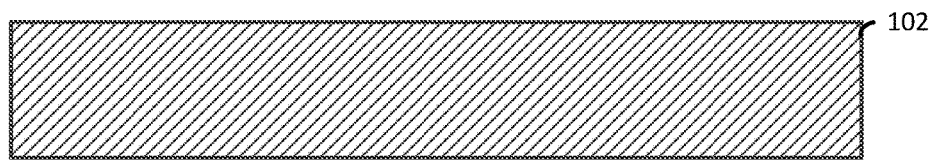
FIG. 8B illustrates a cut-away view along the line B-B (of FIG. 8C)
Figure 8C:
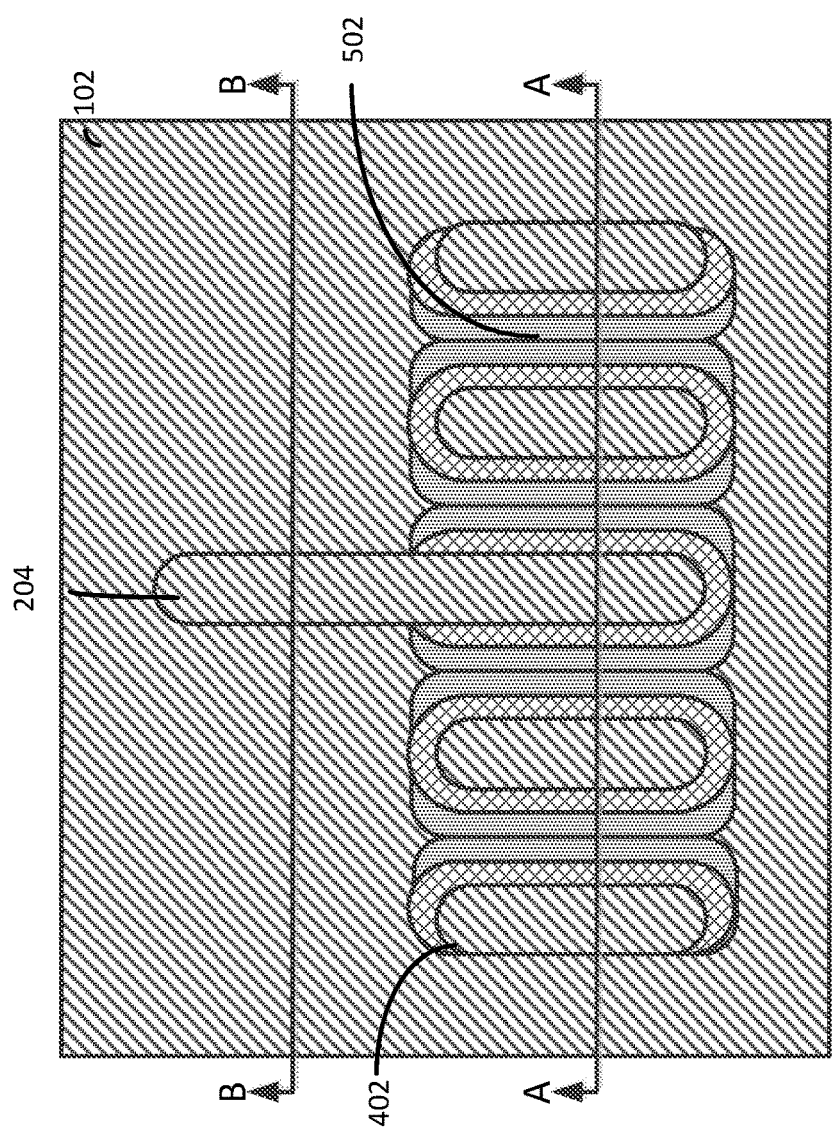
FIG. 8C illustrates a top view following the removal of the mandrels.

FIG. 8A illustrates a cut-away view along the line A-A (of FIG. 8C), FIG. 8B illustrates a cut-away view along the line B-B (of FIG. 8C), and FIG. 8C illustrates a top view following the removal of the mandrels 204 and 208. The mandrels 204 and 208 can be removed to expose portions of the substrate 102 using, for example, a selective etching process.

Figure 9A:
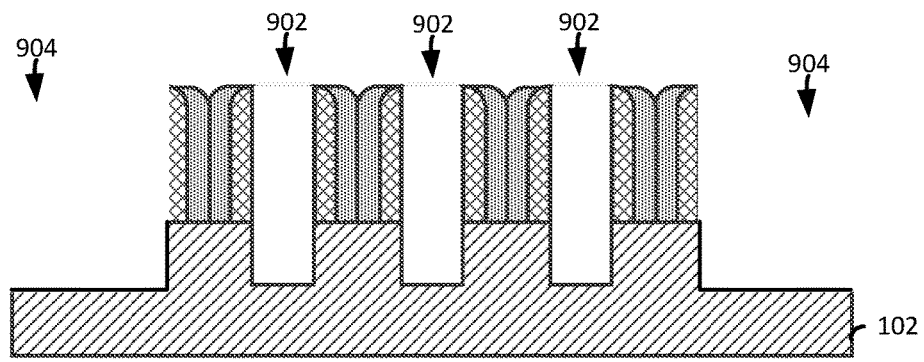
FIG. 9A illustrates a cut-away view along the line A-A (of FIG. 9C)
Figure 9B:
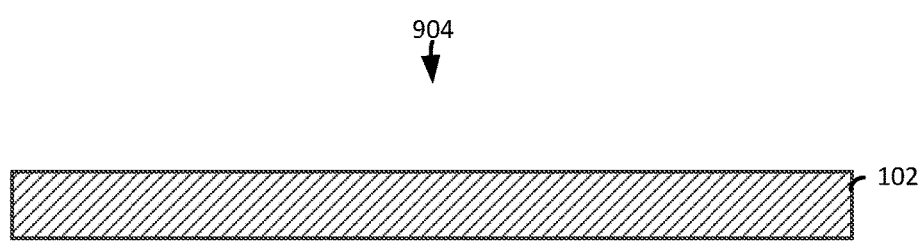
FIG. 9B illustrates a cut-away view along the line B-B (of FIG. 9C)
Figure 9C:
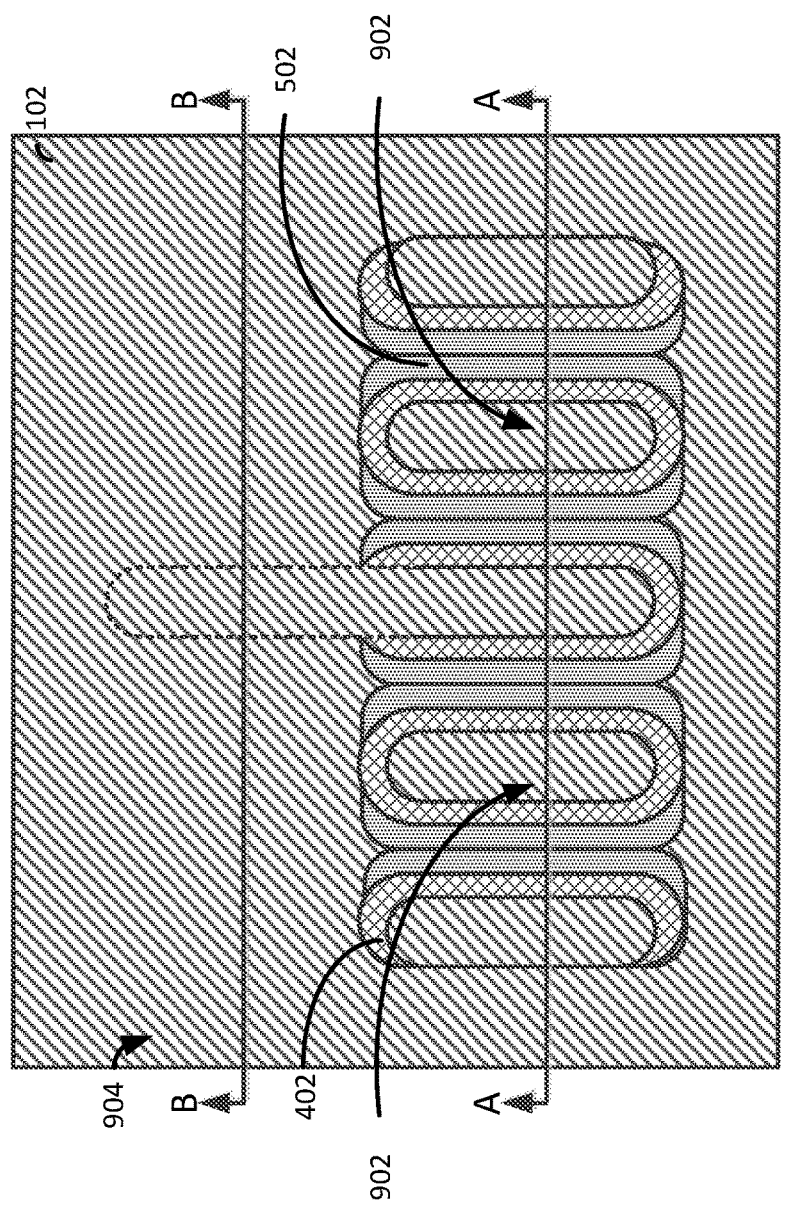
FIG. 9C illustrates a top view following the formation of trenches in the substrate.

FIG. 9A illustrates a cut-away view along the line A-A (of FIG. 9C), FIG. 9B illustrates a cut-away view along the line B-B (of FIG. 9C), and FIG. 9C illustrates a top view following the formation of trenches 902 and 904 in the substrate 102. The trenches 902 and 904 can be formed by, for example, a reactive ion etching process that removes exposed portions of the substrate.

Figure 10A:
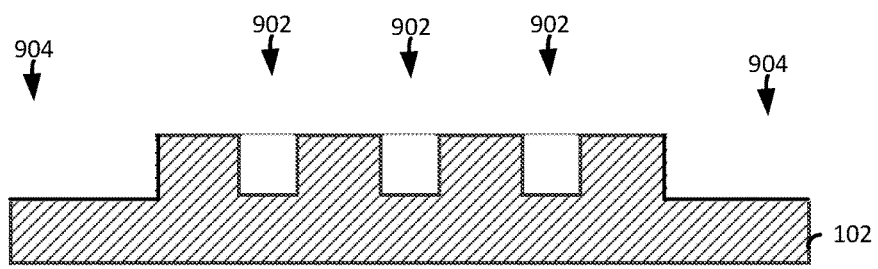
FIG. 10A illustrates a cut-away view along the line A-A (of FIG. 10C)
Figure 10B:
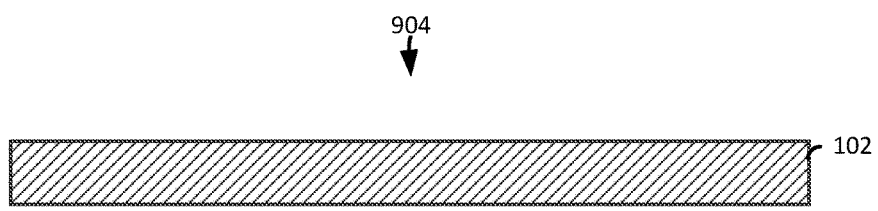
FIG. 10B illustrates a cut-away view along the line B-B (of FIG. 10C)
Figure 10C:
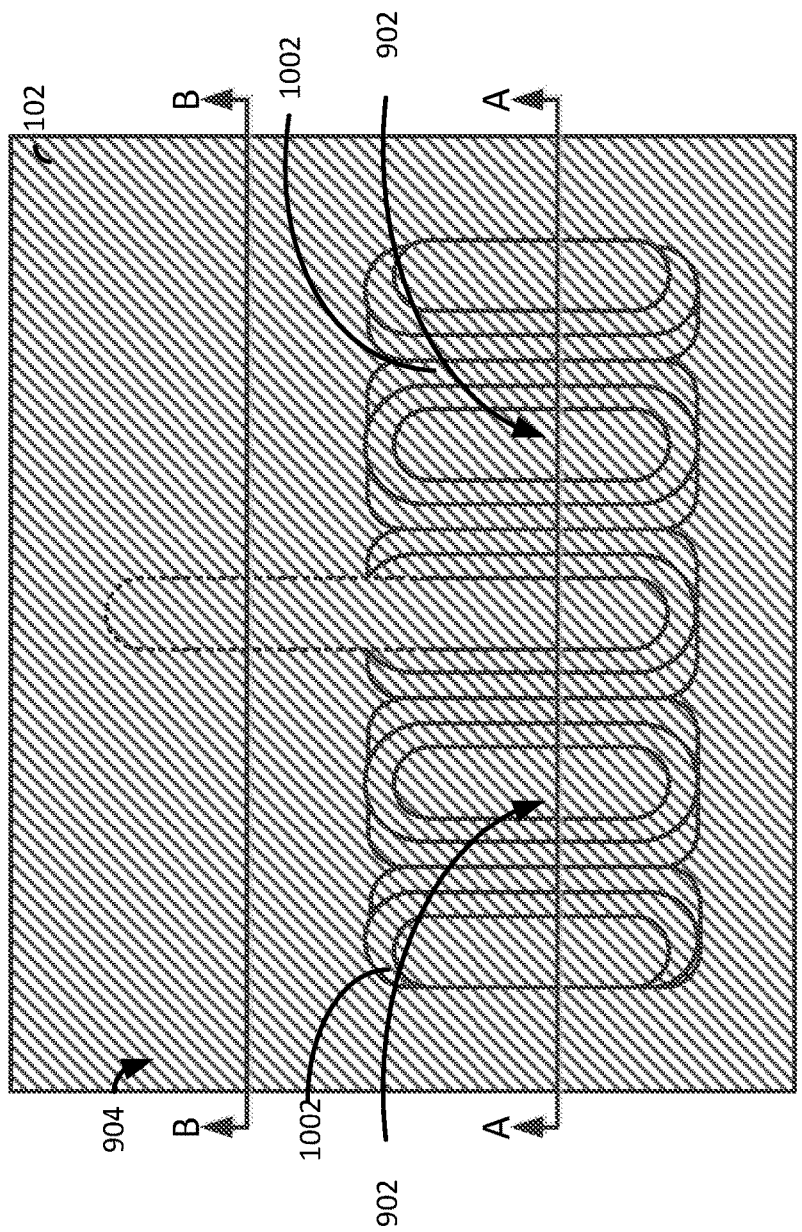
FIG. 10C illustrates a top view following the removal of the spacers (of FIG. 9A) to expose portions of the substrate.

FIG. 10A illustrates a cut-away view along the line A-A (of FIG. 10C), FIG. 10B illustrates a cut-away view along the line B-B (of FIG. 10C), and FIG. 10C illustrates a top view following the removal of the spacers 402 and 602 (of FIG. 9A) to expose portions of the substrate 102. The spacers 402 and 602 can be removed by, for example, a selective etching process or a planarization process.

Figure 11A:
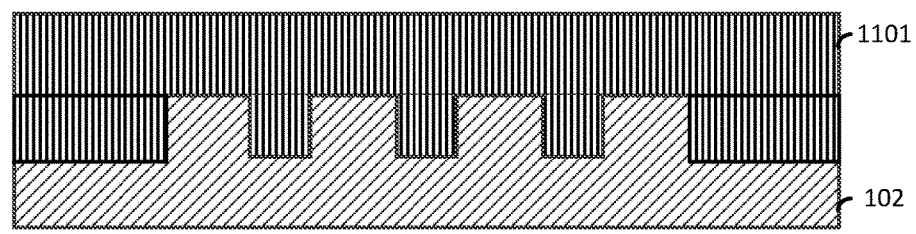
FIG. 11A illustrates a cut-away view along the line A-A (of FIG. 11C)
Figure 11B:
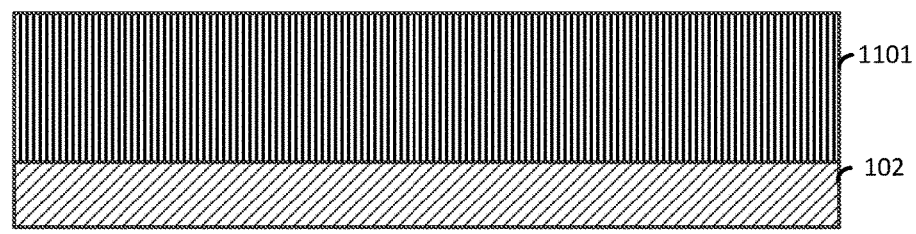
FIG. 11B illustrates a cut-away view along the line B-B (of FIG. 11C)
Figure 11C:
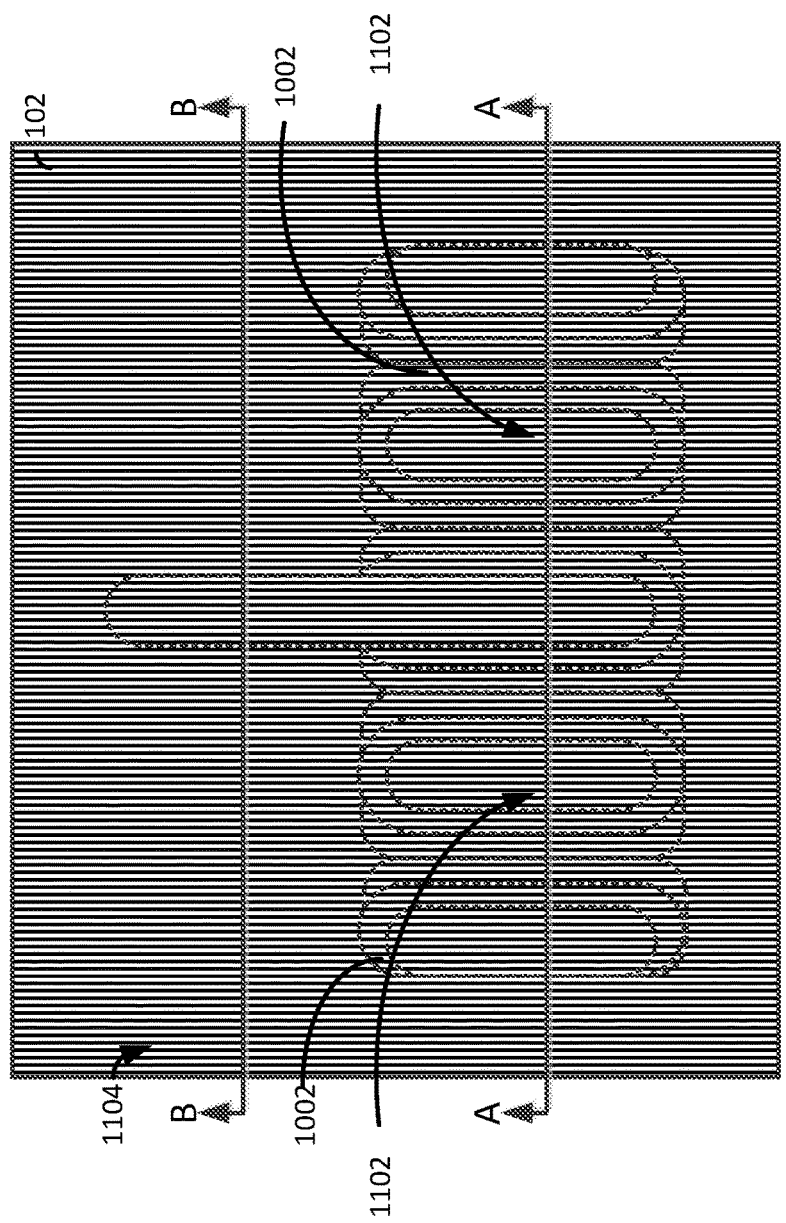
FIG. 11C illustrates a top view following the deposition of a layer of conductive material in the trenches.

FIG. 11A illustrates a cut-away view along the line A-A (of FIG. 11C), FIG. 11B illustrates a cut-away view along the line B-B (of FIG. 11C), and FIG. 11C illustrates a top view following the deposition of a layer of conductive material 1101 in the trenches 902.

The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

Figure 12A:
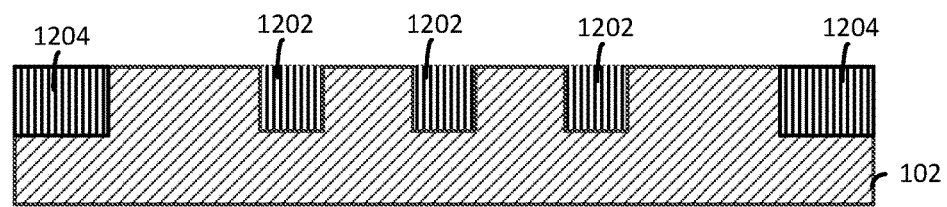
FIG. 12A illustrates a cut-away view along the line A-A (of FIG. 12C)
Figure 12B:
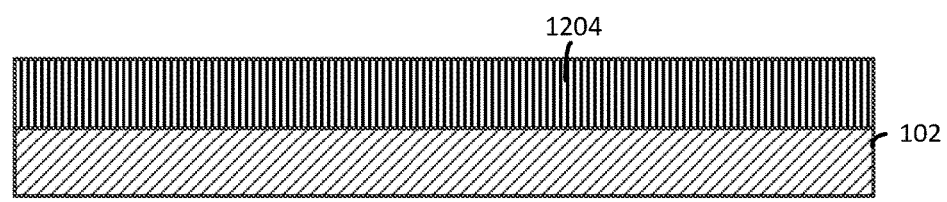
FIG. 12B illustrates a cut-away view along the line B-B (of FIG. 12C)
Figure 12C:
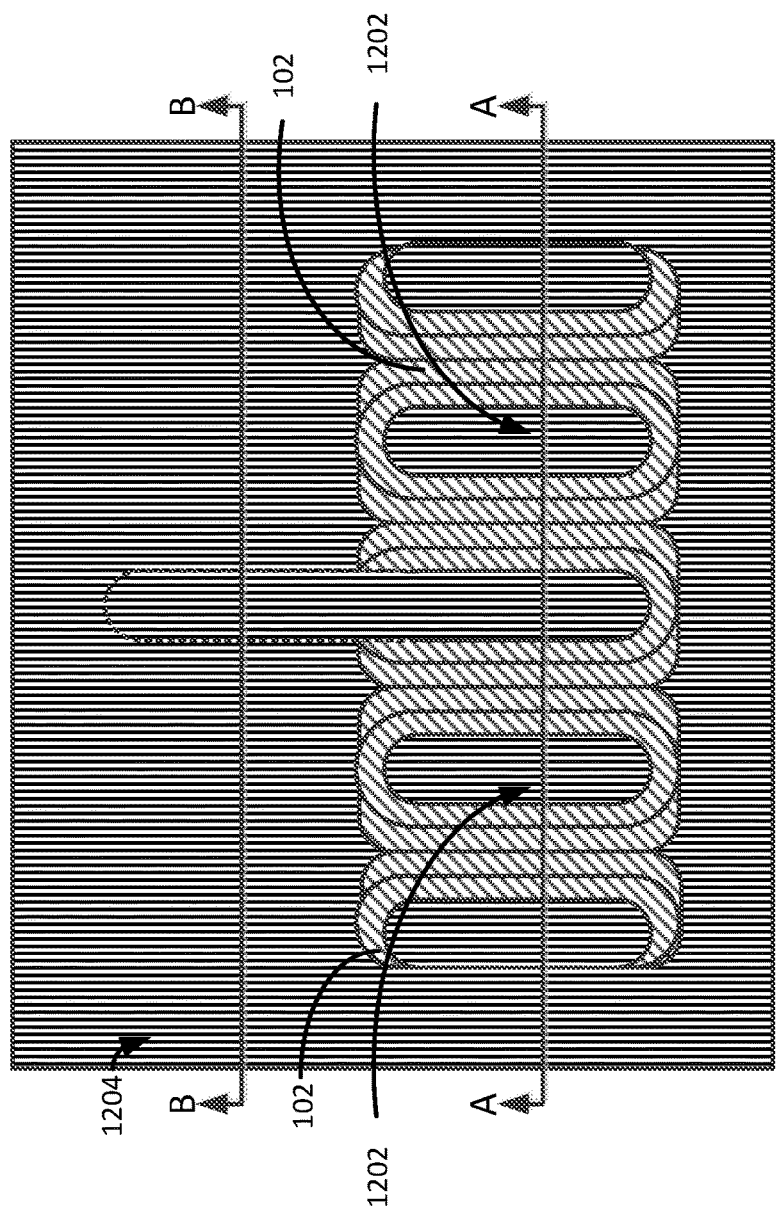

FIG. 12A illustrates a cut-away view along the line A-A (of FIG. 12C), FIG. 12B illustrates a cut-away view along the line B-B (of FIG. 12C), and FIG. 12C illustrates a top view following the formation of conductive lines 1202 and 1204. The conductive lines 1202 and 1204 can be formed by, for example, a planarization process such as, for example, chemical mechanical polishing. Referring to FIG. 12C, the region 1204 of the conductive lines partially defines a non-mandrel line while the regions 1202 define mandrel lines.

The embodiments described above provide for forming mandrel and non-mandrel conductive lines using a single patterning mask to form the mandrels.

FIGS. 13-24C illustrate another exemplary embodiment of a method for forming conductive lines for a semiconductor device.

Figure 13:
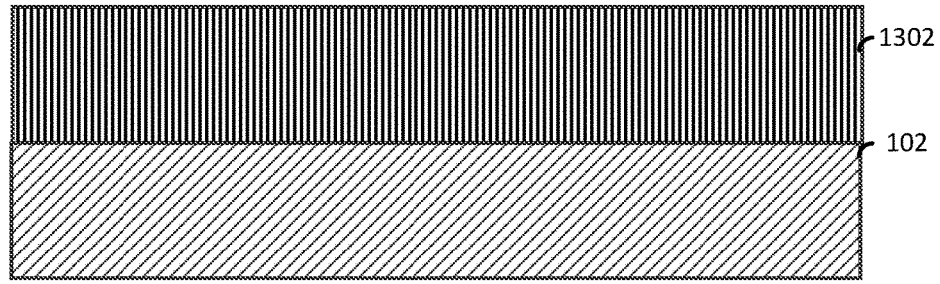

FIG. 13 illustrates a side view of the substrate 102 and a layer of conductive material 1302 arranged on the substrate. The layer of conductive material 1302 can be similar to the layer of conductive material 1101 described above.

Figure 14A:
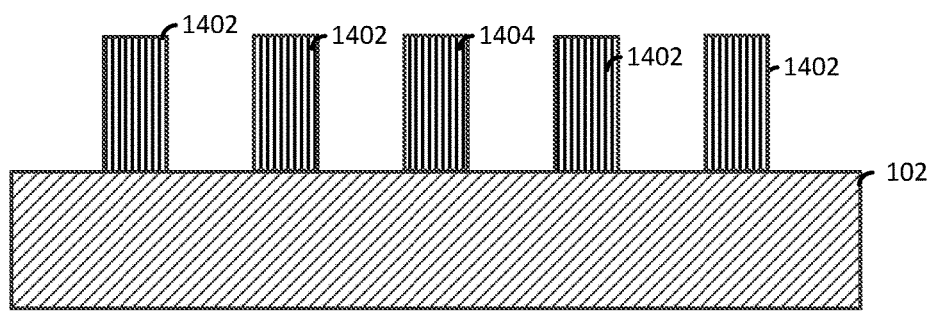
FIG. 14A illustrates a cut-away view along the line A-A (of FIG. 14C)
Figure 14B:
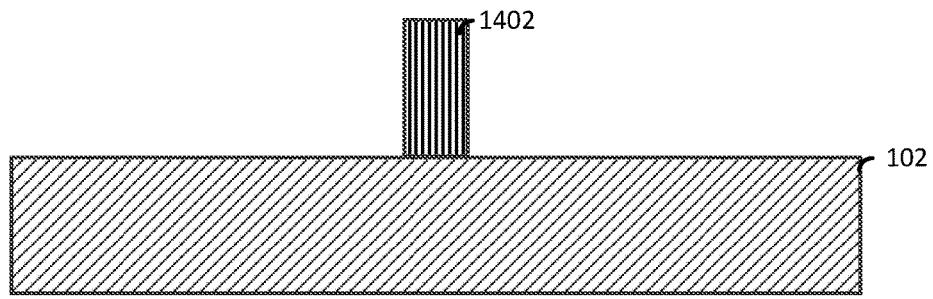
FIG. 14B illustrates a cut-away view along the line B-B (of FIG. 14C)
Figure 14C:
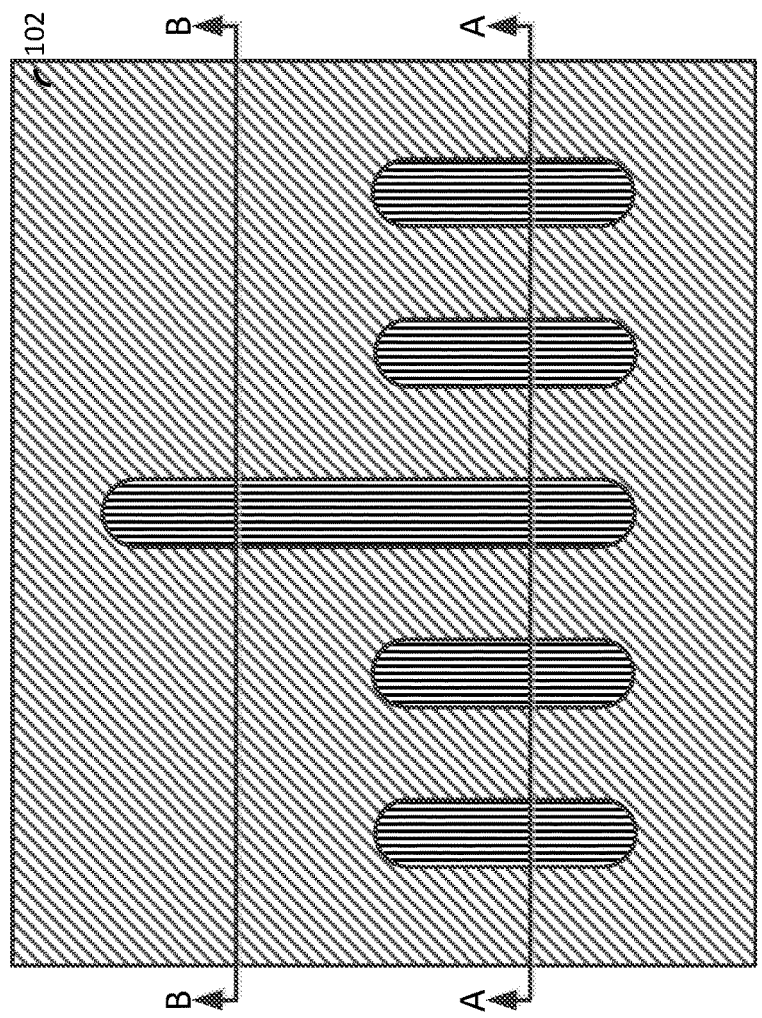
FIG. 14C illustrates a top view following a patterning and etching process that removes portions of the layer of conductive material to form mandrels.

FIG. 14A illustrates a cut-away view along the line A-A (of FIG. 14C), FIG. 14B illustrates a cut-away view along the line B-B (of FIG. 14C), and FIG. 14C illustrates a top view following a patterning and etching process that removes portions of the layer of conductive material 1302 to form mandrels 1402 and 1404.

Figure 15A:
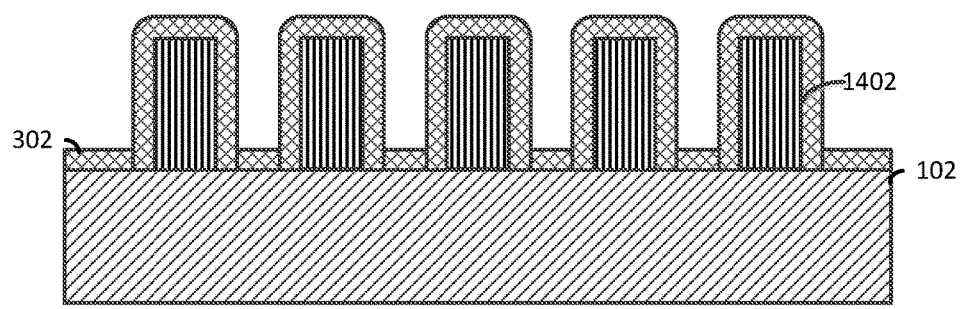
FIG. 15A illustrates a cut-away view along the line A-A (of FIG. 15C)
Figure 15B:
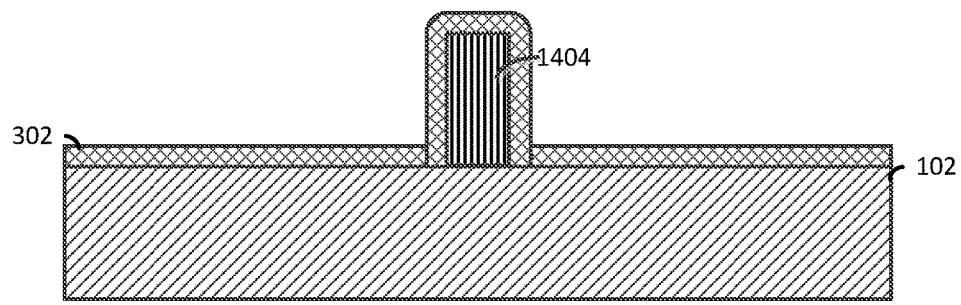
FIG. 15B illustrates a cut-away view along the line B-B (of FIG. 15C)
Figure 15C:
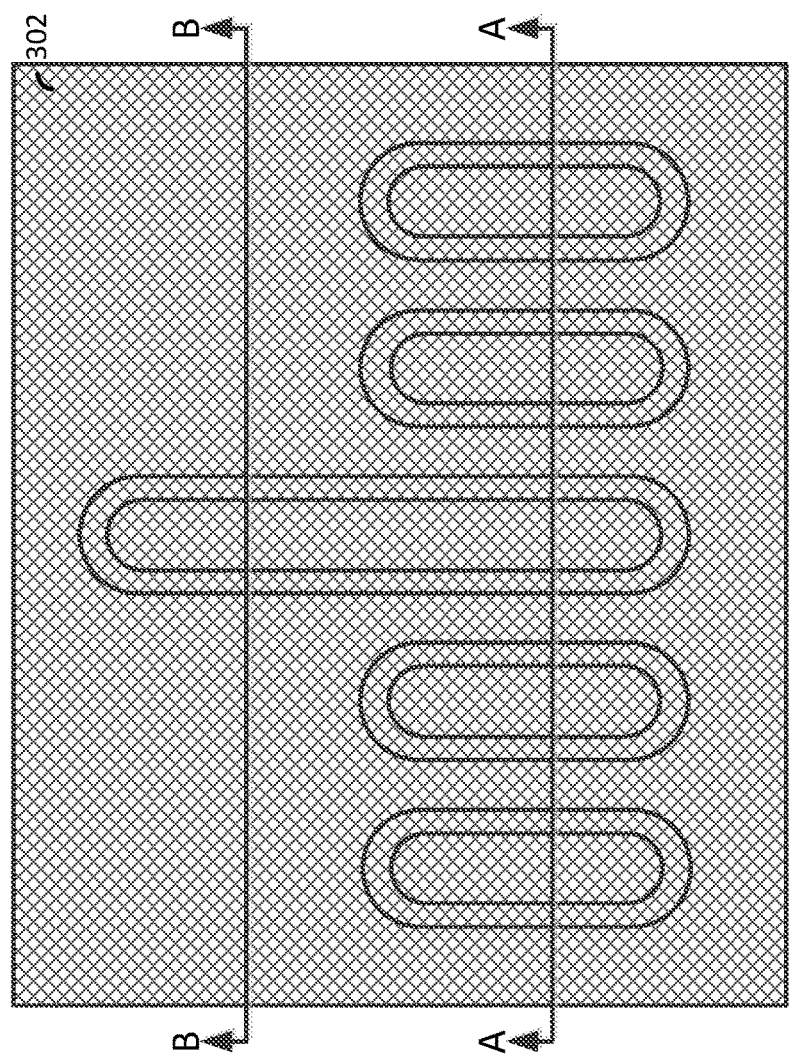
FIG. 15C illustrates a top view following the deposition of a first layer of spacer material.

FIG. 15A illustrates a cut-away view along the line A-A (of FIG. 15C), FIG. 15B illustrates a cut-away view along the line B-B (of FIG. 15C), and FIG. 15C illustrates a top view following the deposition of a first layer of spacer material 302. Non-limiting examples of suitable materials for the layer of spacer material 302 include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Figure 16A:
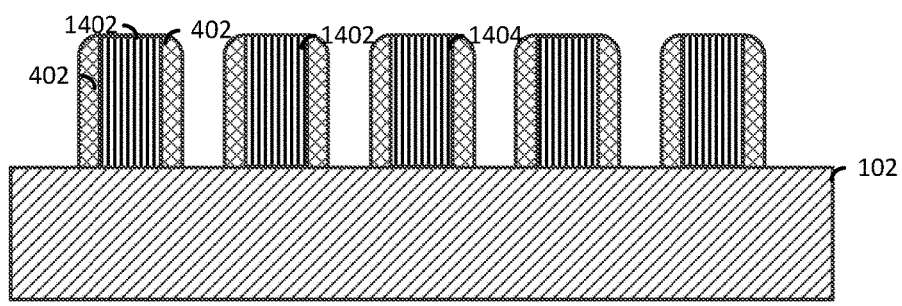
FIG. 16A illustrates a cut-away view along the line A-A (of FIG. 16C)
Figure 16B:
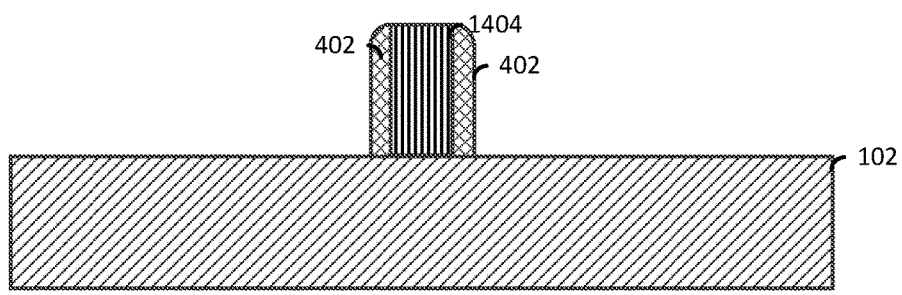
FIG. 16B illustrates a cut-away view along the line B-B (of FIG. 16C)
Figure 16C:
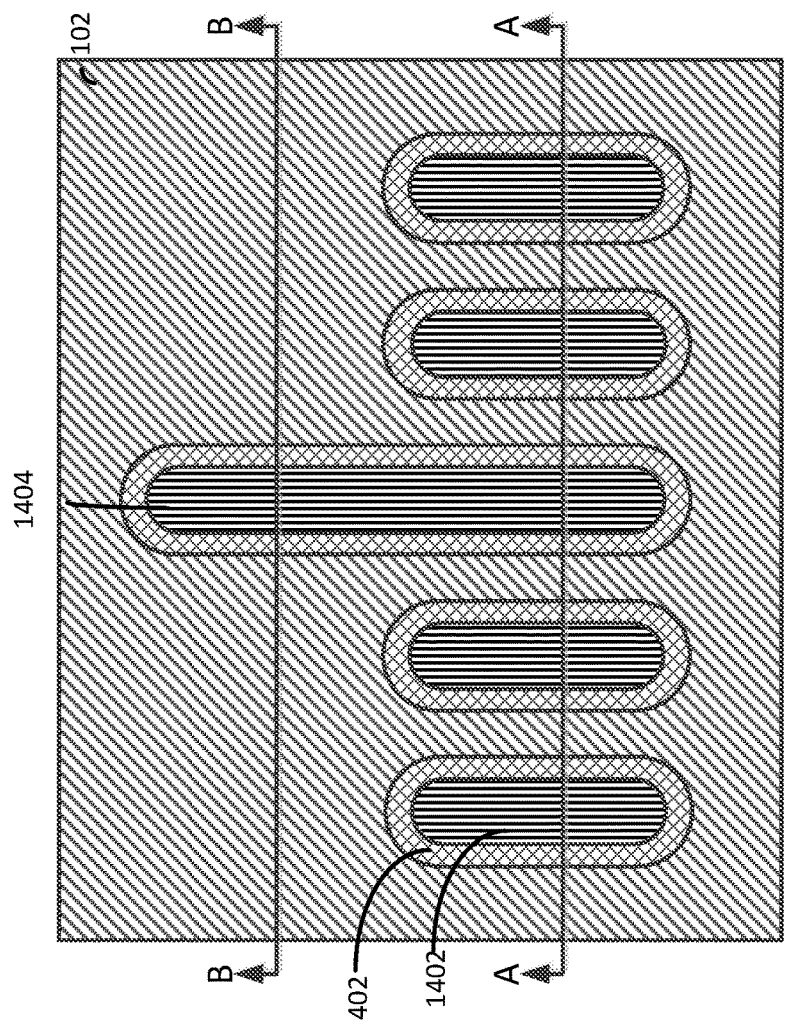
FIG. 16C illustrates a top view following the removal of portions of the layer of spacer material (of FIGS. 15A, 15B, and 15C) to form first spacers.

FIG. 16A illustrates a cut-away view along the line A-A (of FIG. 16C), FIG. 16B illustrates a cut-away view along the line B-B (of FIG. 16C), and FIG. 16C illustrates a top view following the removal of portions of the layer of spacer material 302 (of FIGS. 15A, 15B, and 15C) to form first spacers 402.

Figure 17A:
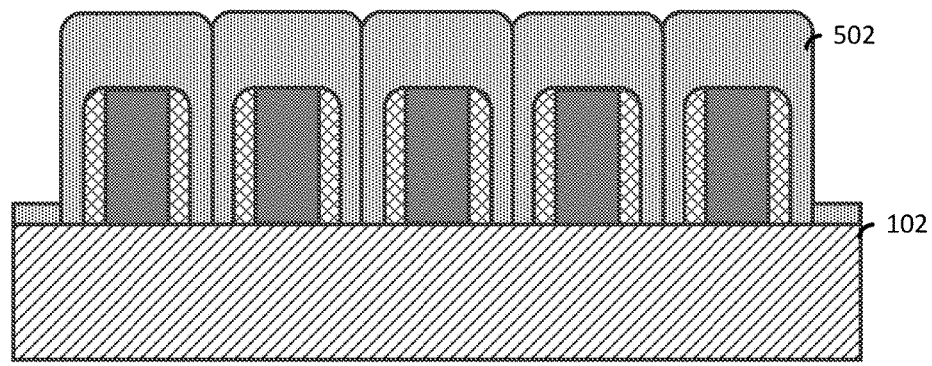
FIG. 17A illustrates a cut-away view along the line A-A (of FIG. 17C)
Figure 17B:
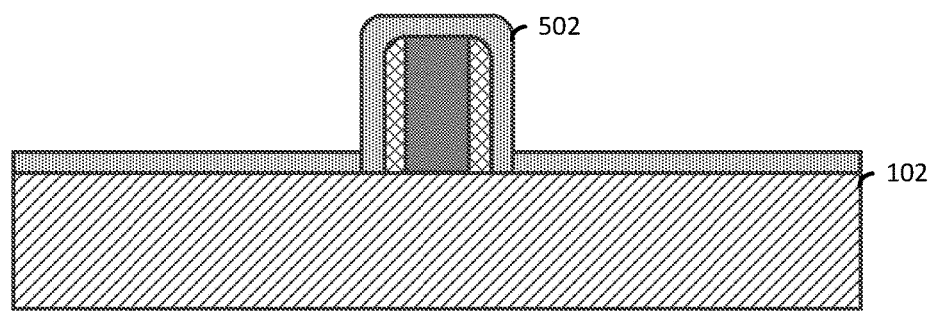
FIG. 17B illustrates a cut-away view along the line B-B (of FIG. 17C)
Figure 17C:
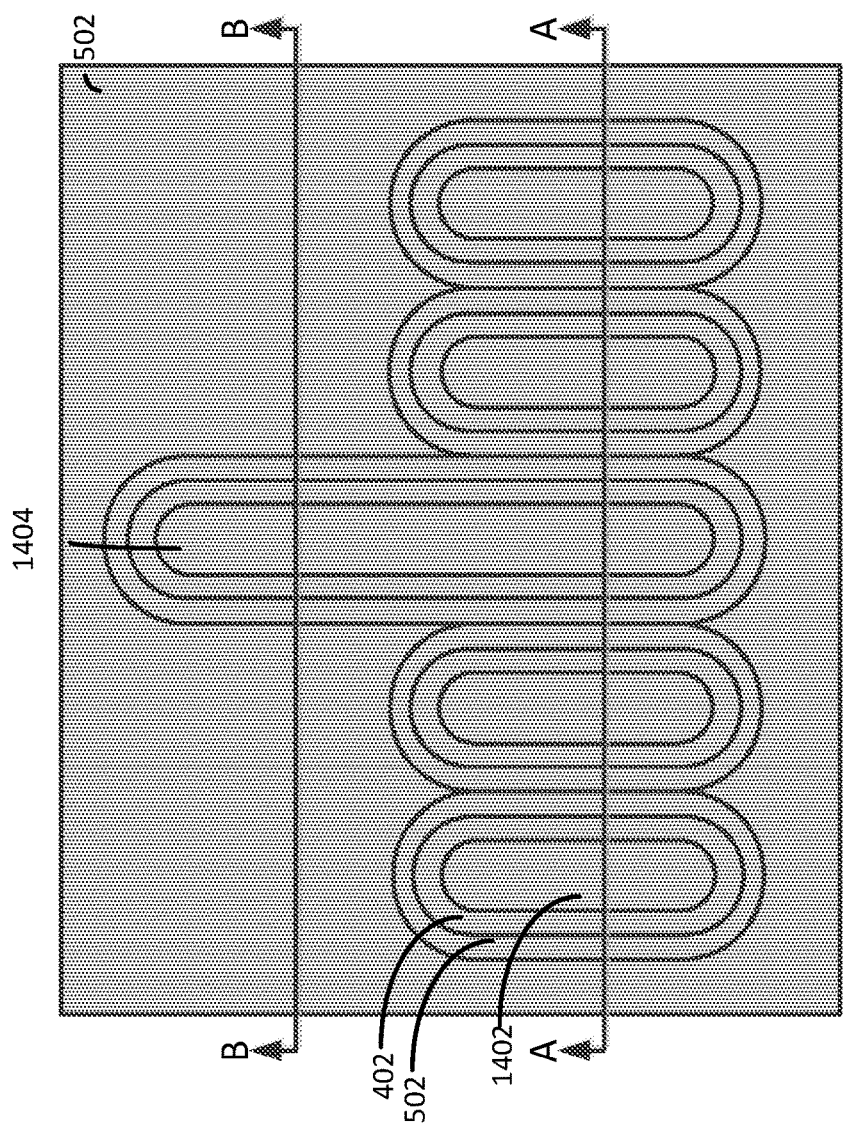
FIG. 17C illustrates a top view following the deposition of a second layer of spacer material over the mandrels, the substrate and the spacers.

FIG. 17A illustrates a cut-away view along the line A-A (of FIG. 17C), FIG. 17B illustrates a cut-away view along the line B-B (of FIG. 17C), and FIG. 17C illustrates a top view following the deposition of a second layer of spacer material 502 over the mandrels 1402 and 1404, the substrate 102 and the spacers 402.

Figure 18A:
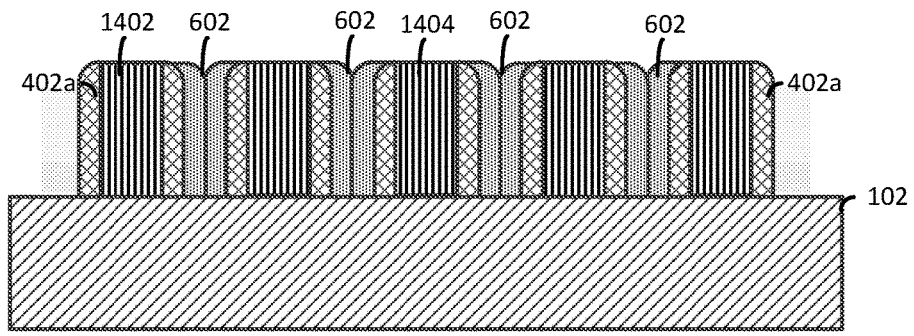
FIG. 18A illustrates a cut-away view along the line A-A (of FIG. 18C)
Figure 18B:
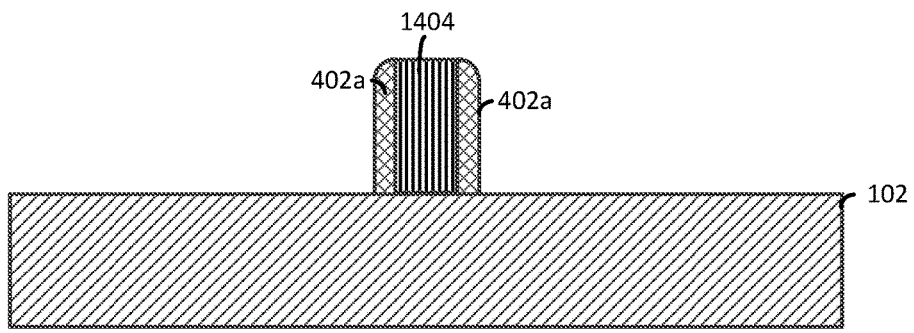
FIG. 18B illustrates a cut-away view along the line B-B (of FIG. 18C)
Figure 18C:
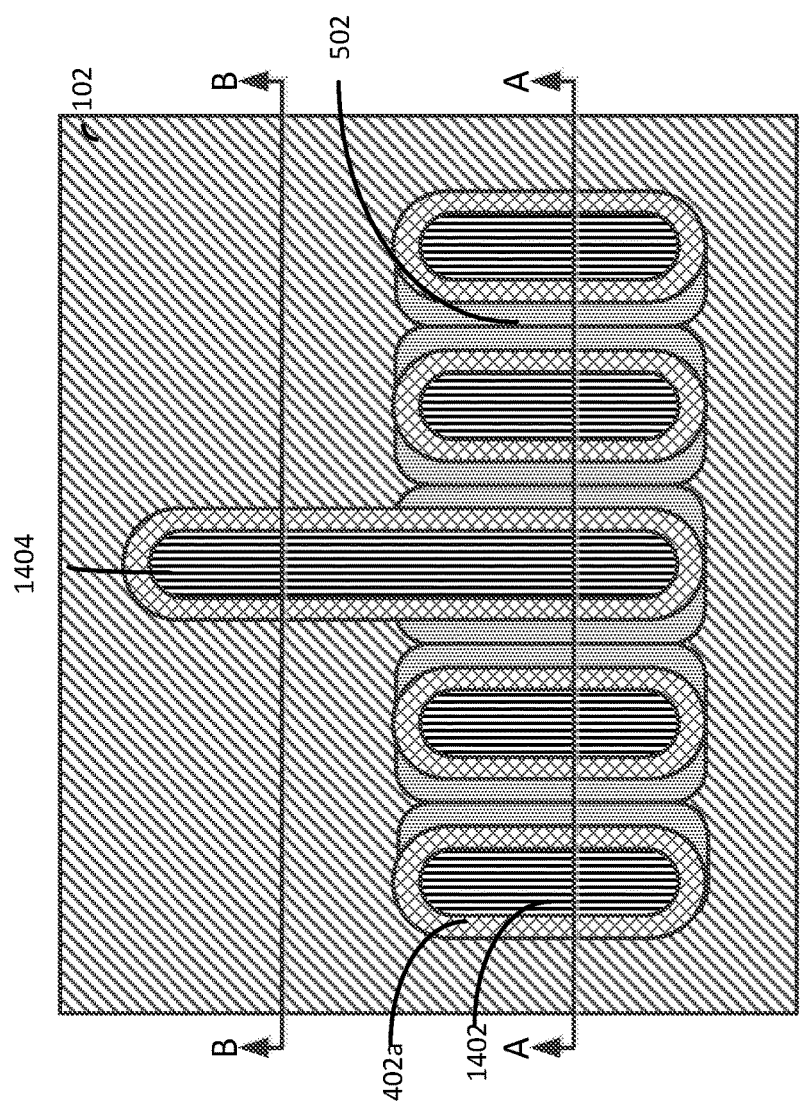
FIG. 18C illustrates a top view following an etching process that removes portions of the second layer of spacer material to form second spacers.

FIG. 18A illustrates a cut-away view along the line A-A (of FIG. 18C), FIG. 18B illustrates a cut-away view along the line B-B (of FIG. 18C), and FIG. 18C illustrates a top view following an etching process that removes portions of the second layer of spacer material 502 to form second spacers 602.

Figure 19A:
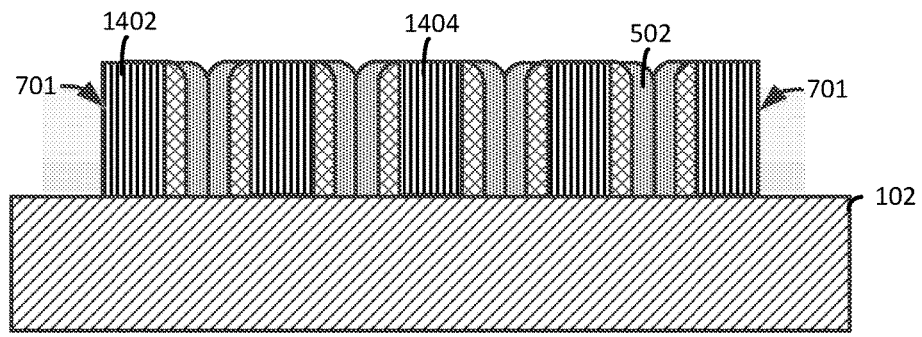
FIG. 19A illustrates a cut-away view along the line A-A (of FIG. 19C)
Figure 19B:
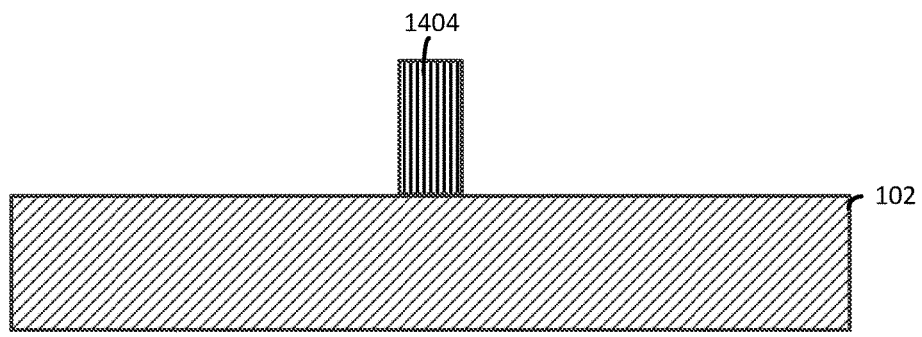
FIG. 19B illustrates a cut-away view along the line B-B (of FIG. 19C)
Figure 19C:
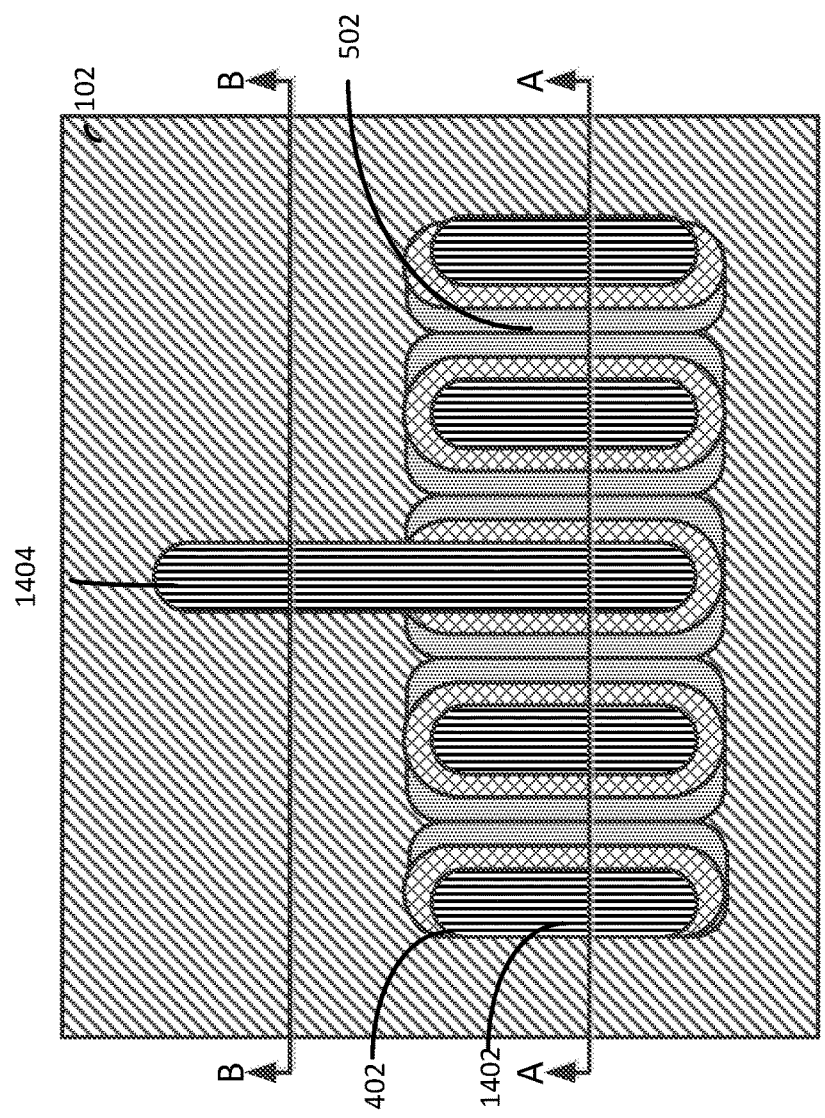
FIG. 19C illustrates a top view following the removal of the exposed first spacers (of FIGS. 18A, 18B, and 18C).

FIG. 19A illustrates a cut-away view along the line A-A (of FIG. 19C), FIG. 19B illustrates a cut-away view along the line B-B (of FIG. 19C), and FIG. 19C illustrates a top view following the removal of the exposed first spacers 402a (of FIGS. 18A, 18B, and 18C).

Figure 20A:
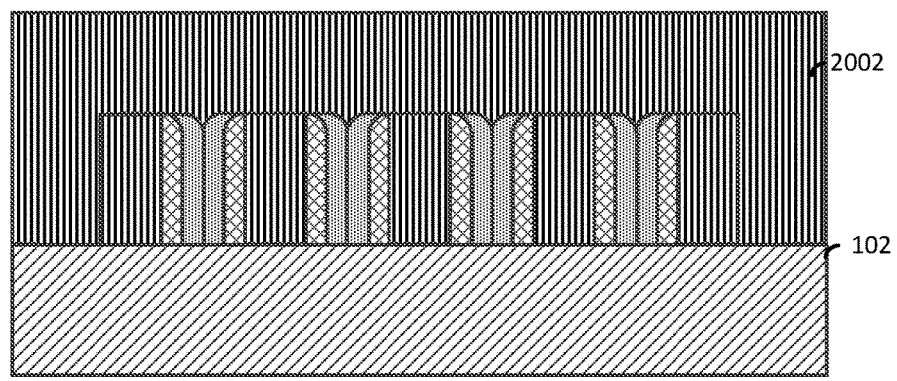
FIG. 20A illustrates a cut-away view along the line A-A (of FIG. 20C)
Figure 20B:
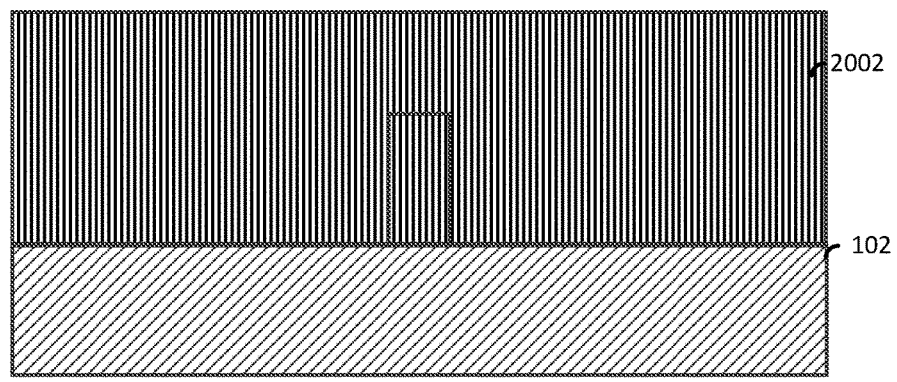
FIG. 20B illustrates a cut-away view along the line B-B (of FIG. 20C)
Figure 20C:
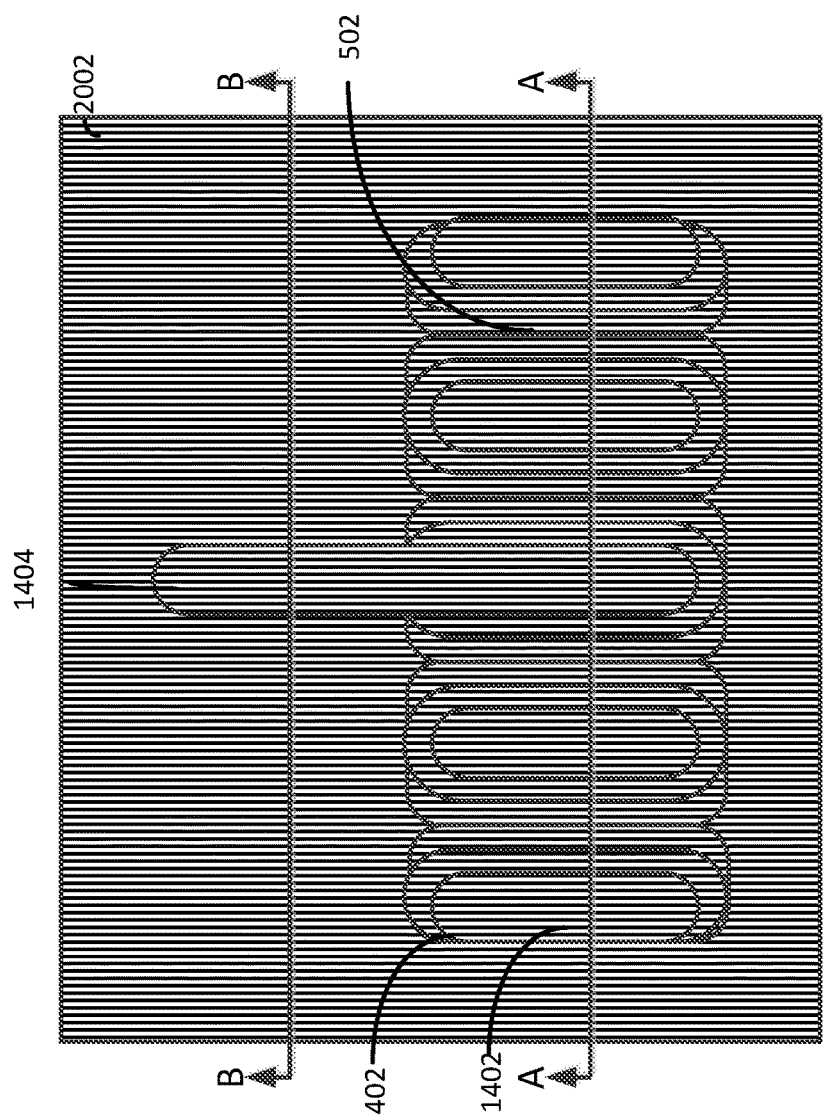
FIG. 20C illustrates a top view following the deposition of a layer of conductive material.

FIG. 20A illustrates a cut-away view along the line A-A (of FIG. 20C), FIG. 20B illustrates a cut-away view along the line B-B (of FIG. 20C), and FIG. 20C illustrates a top view following the deposition of a layer of conductive material 2002.

Figure 21A:
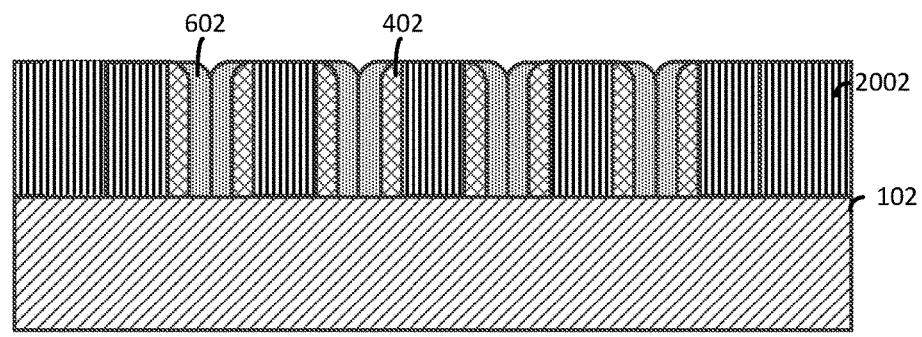
FIG. 21A illustrates a cut-away view along the line A-A (of FIG. 21C)
Figure 21B:
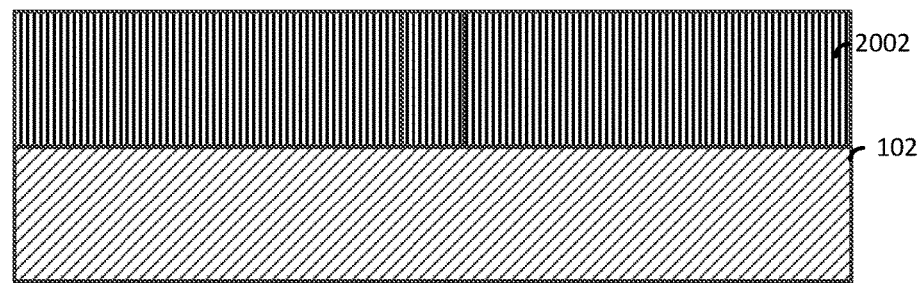
FIG. 21B illustrates a cut-away view along the line B-B (of FIG. 21C)
Figure 21C:
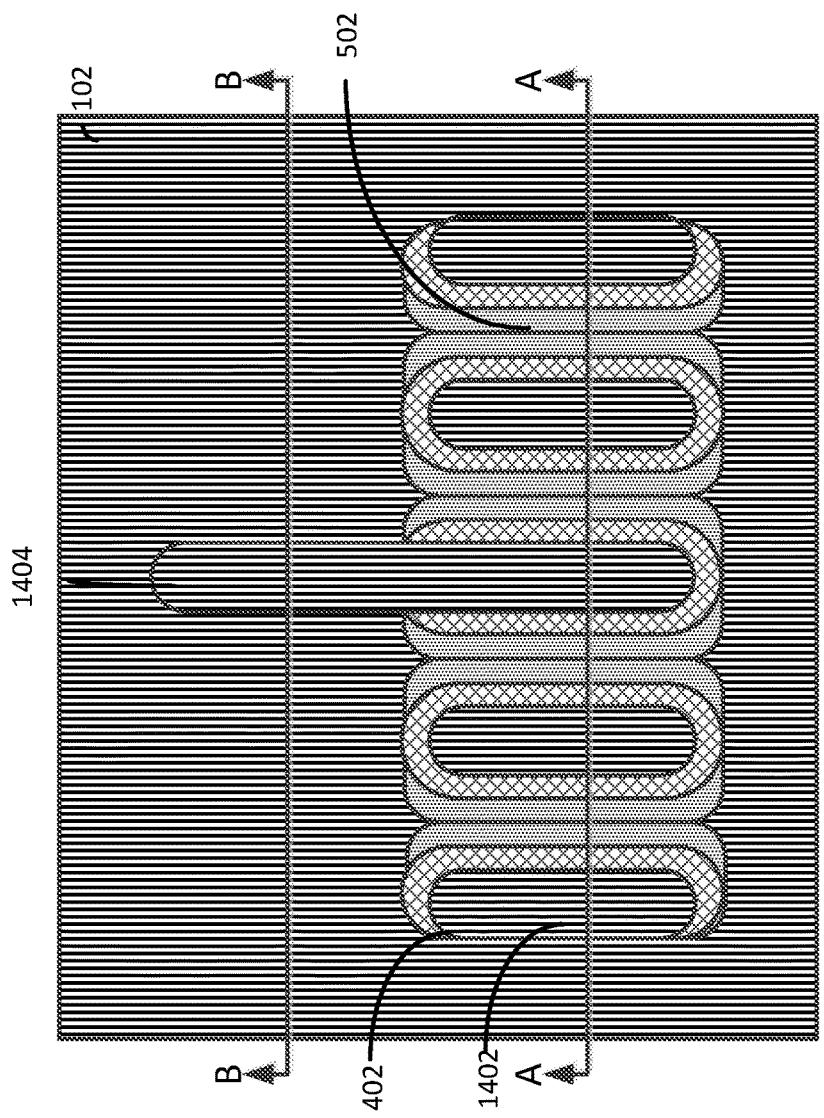
FIG. 21C illustrates a top view following a planarization process that exposes portions of the spacers.

FIG. 21A illustrates a cut-away view along the line A-A (of FIG. 21C), FIG. 21B illustrates a cut-away view along the line B-B (of FIG. 21C), and FIG. 21C illustrates a top view following a planarization process that exposes portions of the spacers 402 and 602.

Figure 22A:
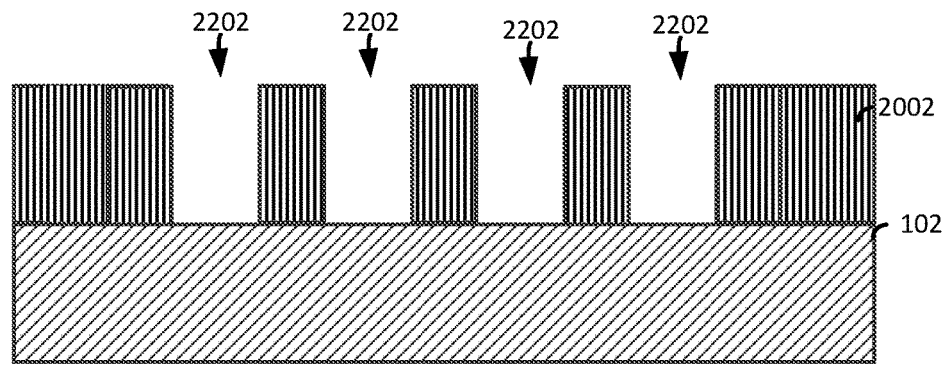
FIG. 22A illustrates a cut-away view along the line A-A (of FIG. 22C)
Figure 22B:
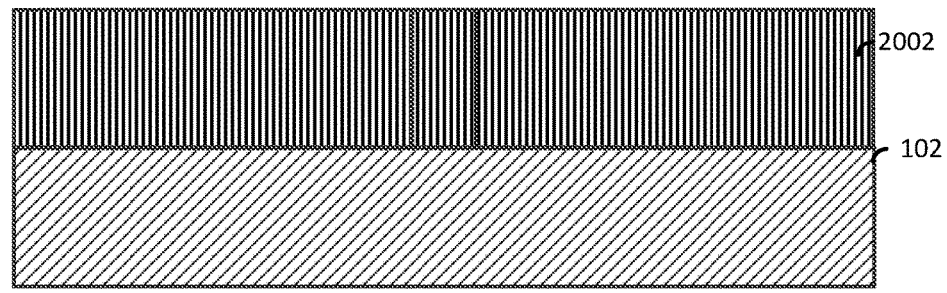
FIG. 22B illustrates a cut-away view along the line B-B (of FIG. 22C)
Figure 22C:
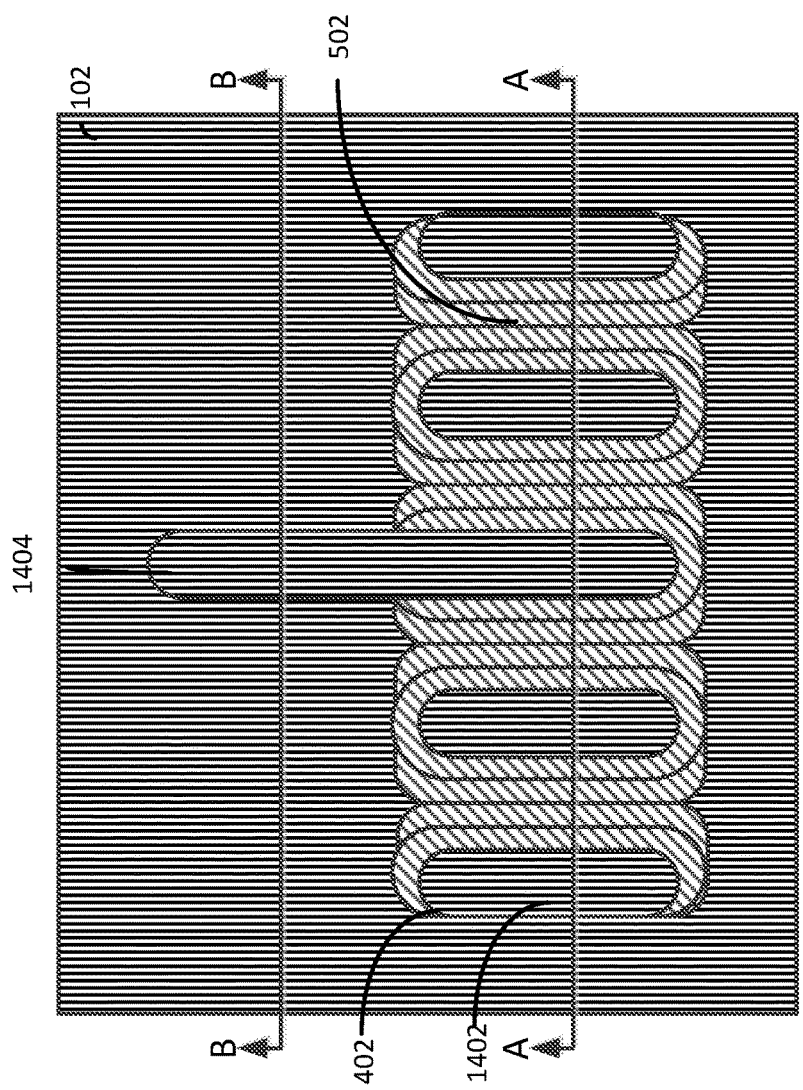
FIG. 22C illustrates a top view following the removal of the spacers (of FIG. 21A) to form cavities that expose portions of the substrate.

FIG. 22A illustrates a cut-away view along the line A-A (of FIG. 22C), FIG. 22B illustrates a cut-away view along the line B-B (of FIG. 22C), and FIG. 22C illustrates a top view following the removal of the spacers 402 and 602 (of FIG. 21A) to form cavities 2202 that expose portions of the substrate 102.

Figure 23A:
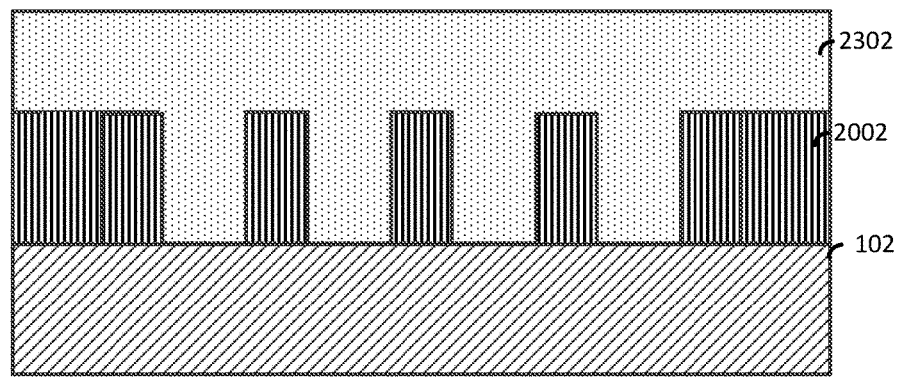
FIG. 23A illustrates a cut-away view along the line A-A (of FIG. 23C)
Figure 23B:
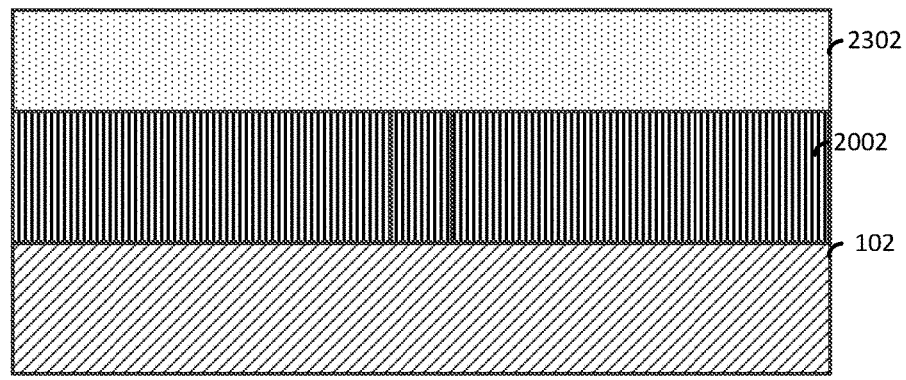
FIG. 23B illustrates a cut-away view along the line B-B (of FIG. 23C)
Figure 23C:
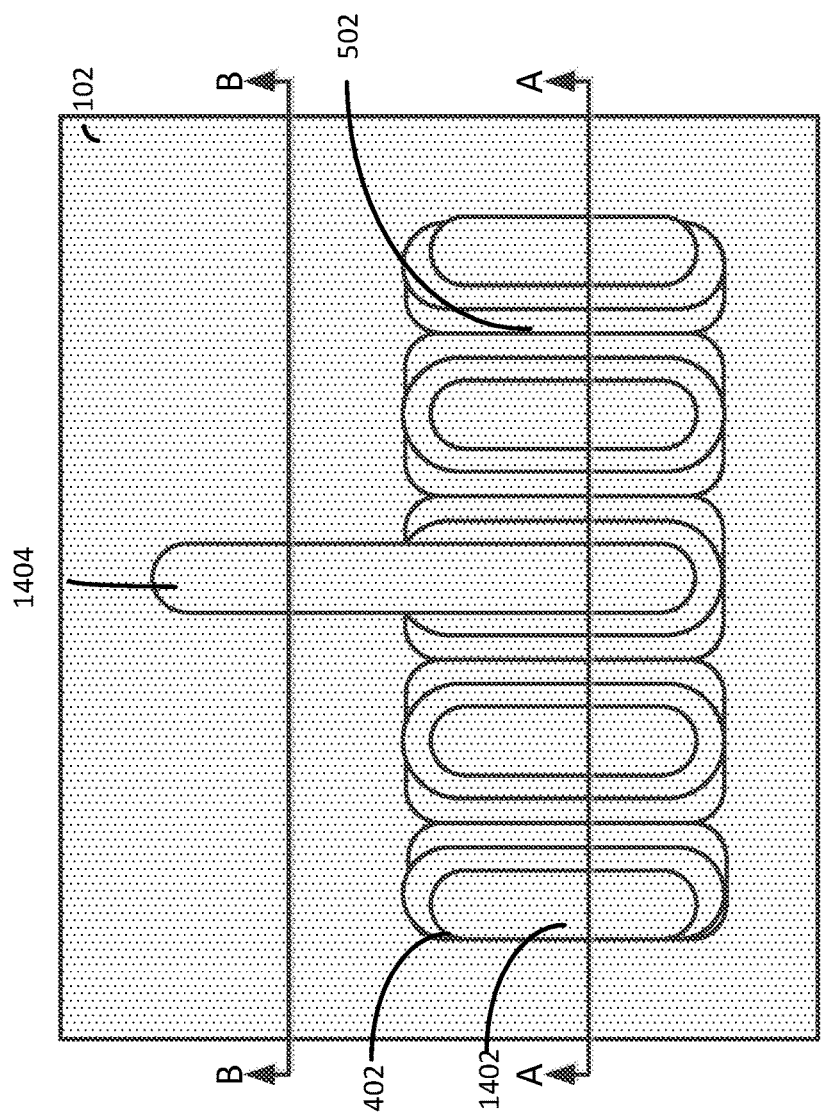
FIG. 23C illustrates a top view following the deposition of a layer of fill material in the cavities.

FIG. 23A illustrates a cut-away view along the line A-A (of FIG. 23C), FIG. 23B illustrates a cut-away view along the line B-B (of FIG. 23C), and FIG. 23C illustrates a top view following the deposition of a layer of fill material 2302 in the cavities 2202. The layer of fill material can include, for example, a dielectric material, an insulator material, or a semiconductor material such as, for example, a silicon or germanium material.

Figure 24A:
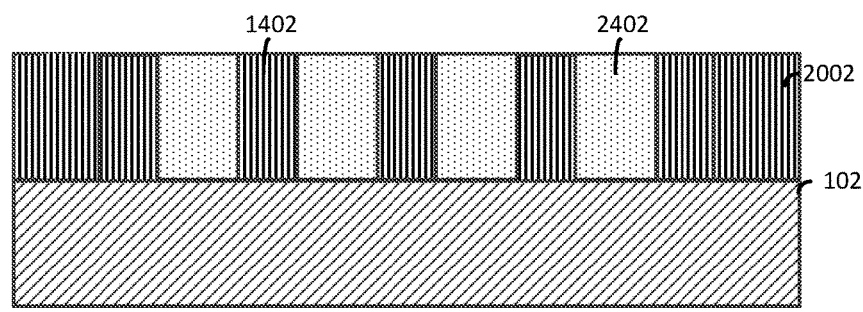
FIG. 24A illustrates a cut-away view along the line A-A (of FIG. 24C)
Figure 24B:
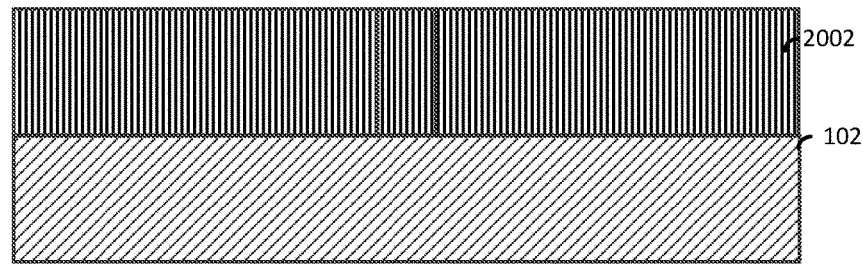
FIG. 24B illustrates a cut-away view along the line B-B (of FIG. 24C)
Figure 24C:
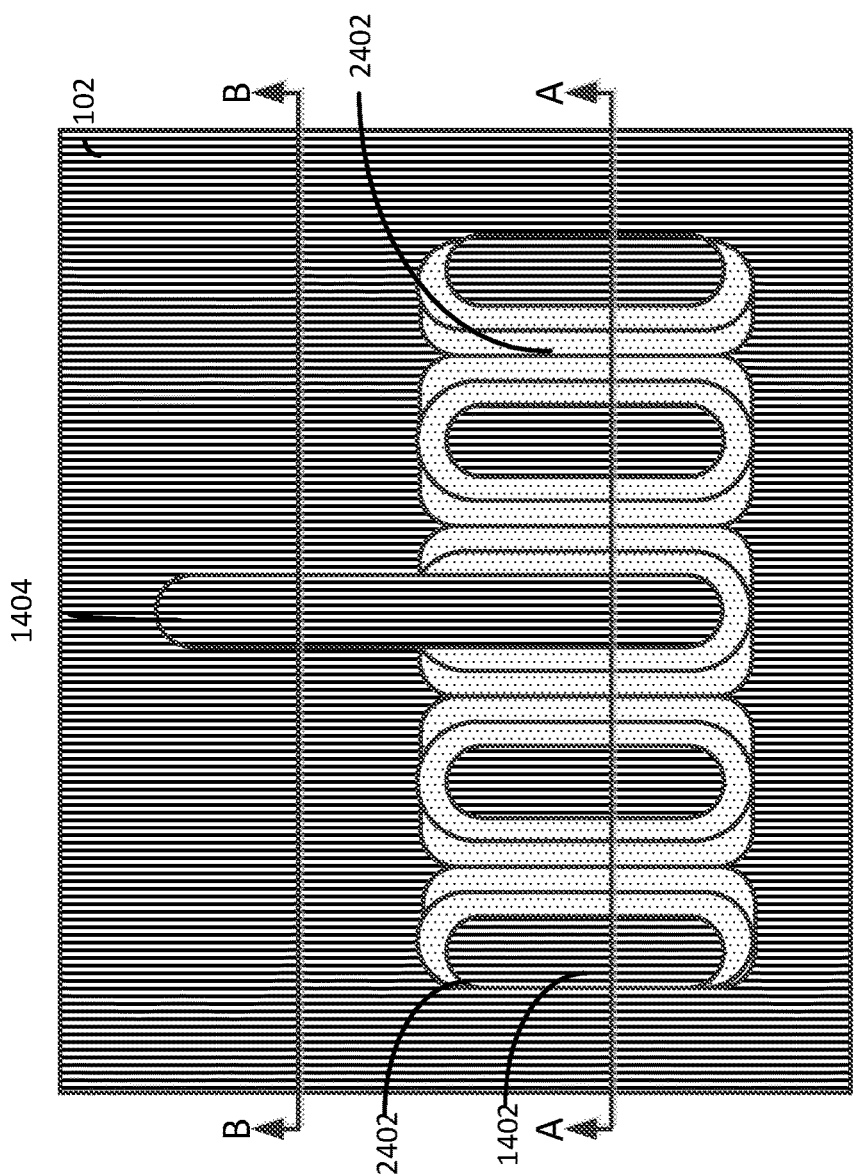

FIG. 24A illustrates a cut-away view along the line A-A (of FIG. 24C), FIG. 24B illustrates a cut-away view along the line B-B (of FIG. 24C), and FIG. 24C illustrates a top view following a planarization process that removes portions of the layer of fill material 2302 to expose the conductive lines 1402 and 2002 and form fill regions 2402.

The methods described above for forming mandrel and non-mandrel lines provide for forming lines using a conductive material as the layer of mandrel material.

FIGS. 25-29 illustrate another exemplary method for forming conductive lines for a semiconductor device.

Figure 25:
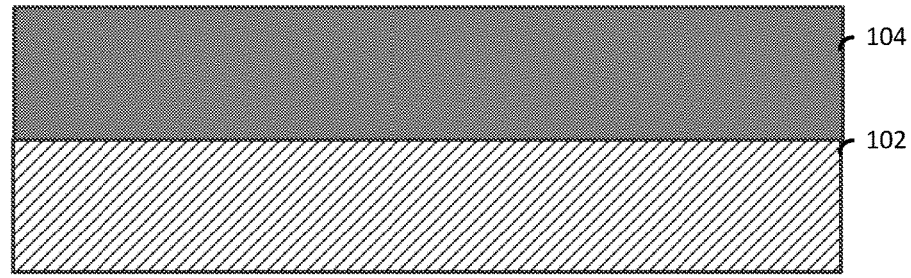

FIG. 25 illustrates a side view of a substrate 102 and a mandrel layer 104 arranged on the substrate 102.

Figure 26A:
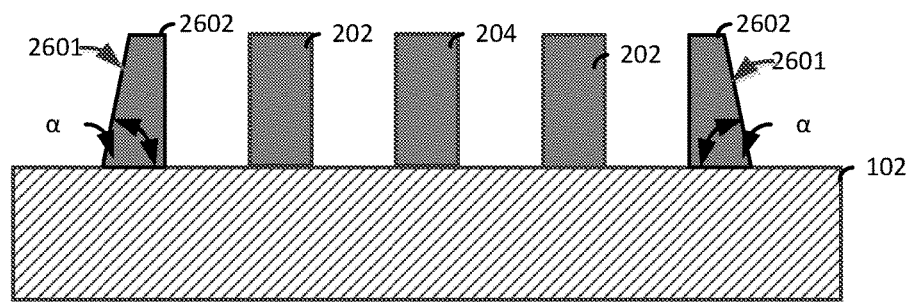
FIG. 26A illustrates a cut-away view along the line A-A (of FIG. 26C)
Figure 26B:
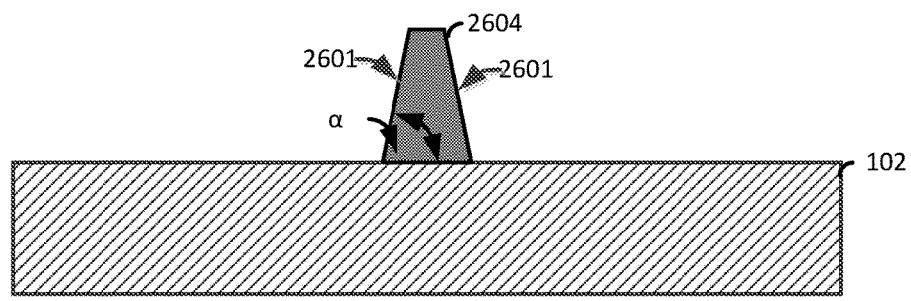
FIG. 26B illustrates a cut-away view along the line B-B (of FIG. 26C)
Figure 26C:
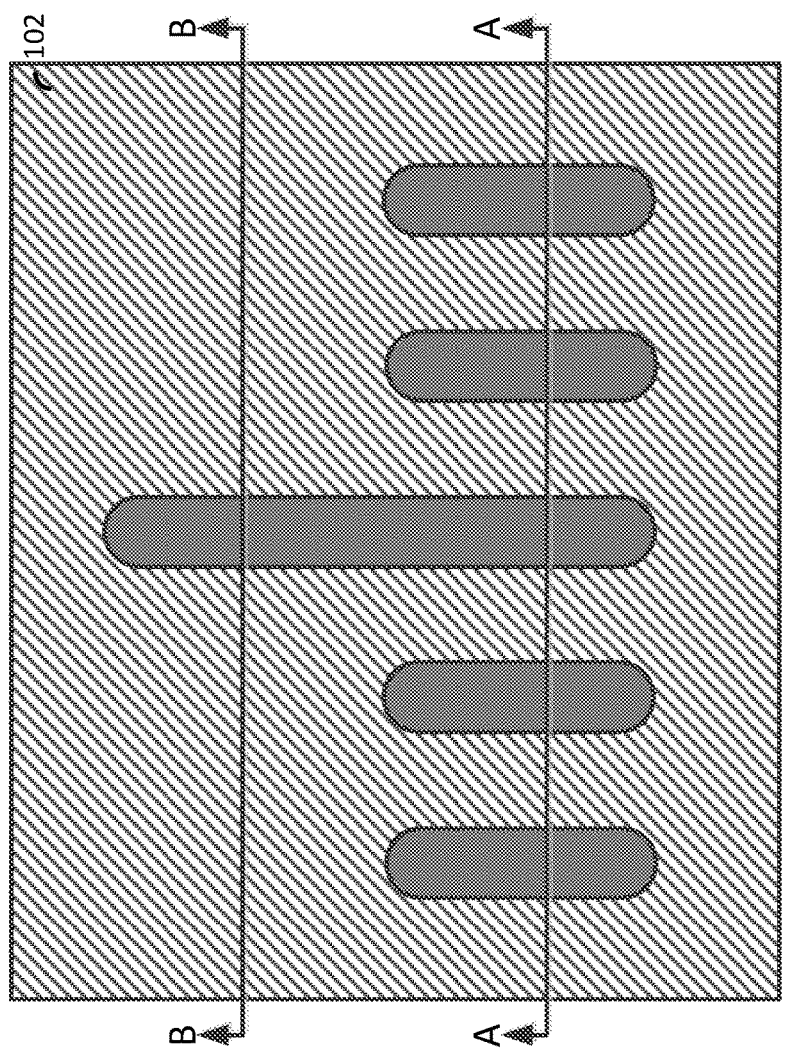
FIG. 26C illustrates a top view following a patterning and etching process that forms mandrels on the substrate.

FIG. 26A illustrates a cut-away view along the line A-A (of FIG. 26C), FIG. 26B illustrates a cut-away view along the line B-B (of FIG. 26C), and FIG. 26C illustrates a top view following a patterning and etching process that forms mandrels 202, 204, and 2602 on the substrate 102. The etching process can include for example, reactive ion etching. The etching process forms outwardly facing sidewalls 2601 having a sloped surface that has an oblique angle ($\alpha$) with respect to the substrate 102 surface. The mandrel 204 has a region 2604 that includes outwardly facing sidewalls 2601 arranged at the oblique angle $\alpha$.

Figure 27A:
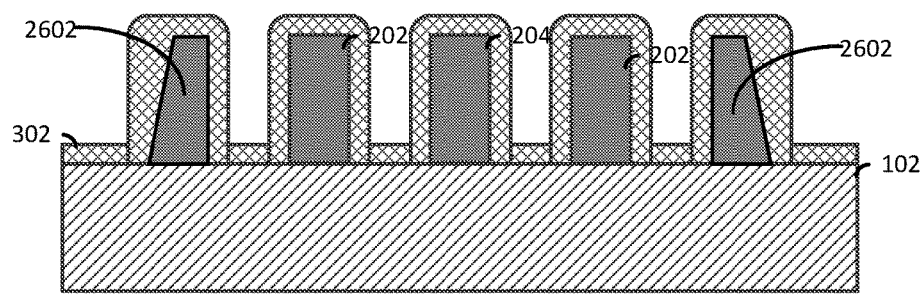
FIG. 27A illustrates a cut-away view along the line A-A (of FIG. 27C)
Figure 27B:
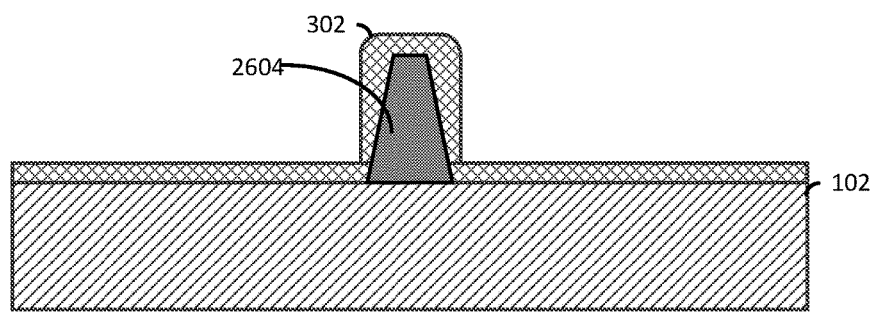
FIG. 27B illustrates a cut-away view along the line B-B (of FIG. 27C)
Figure 27C:
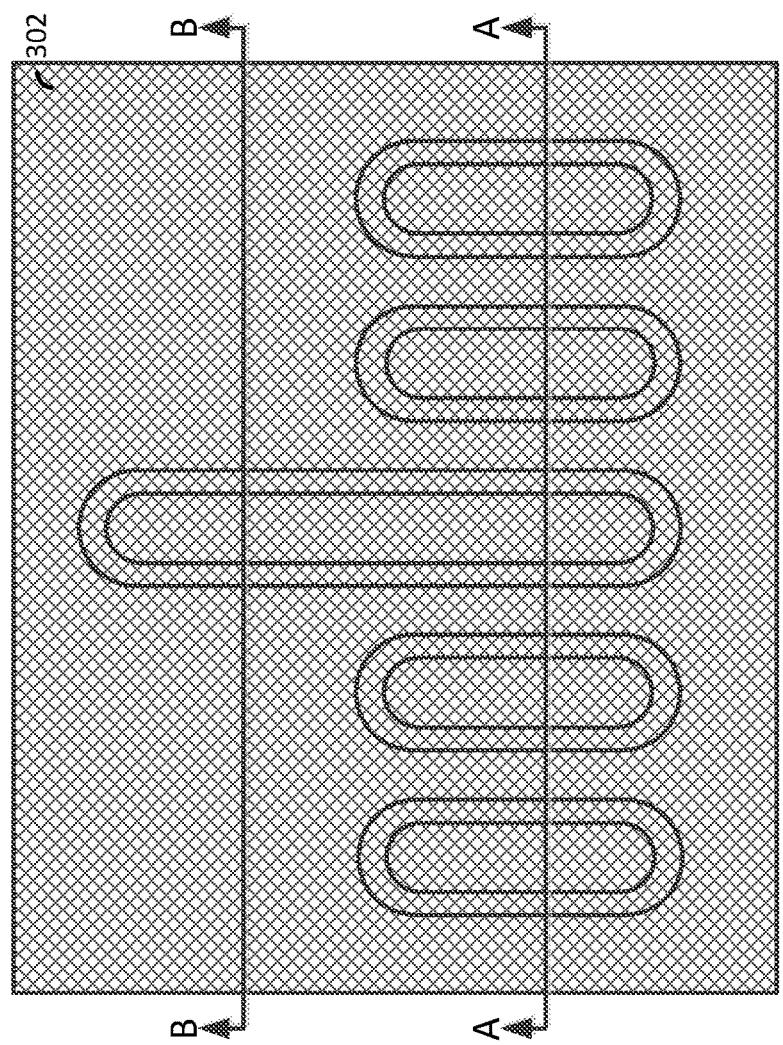
FIG. 27C illustrates a top view following the deposition of a first layer of spacer material.

FIG. 27A illustrates a cut-away view along the line A-A (of FIG. 27C), FIG. 27B illustrates a cut-away view along the line B-B (of FIG. 27C), and FIG. 27C illustrates a top view following the deposition of a first layer of spacer material 302.

Figure 28A:
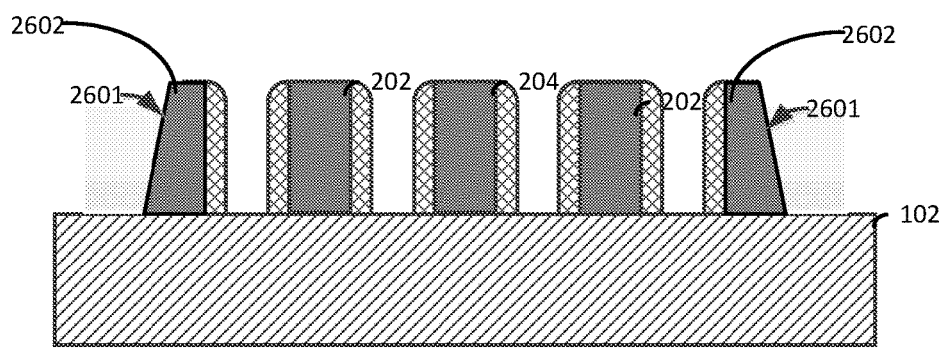
FIG. 28A illustrates a cut-away view along the line A-A (of FIG. 28C)
Figure 28B:
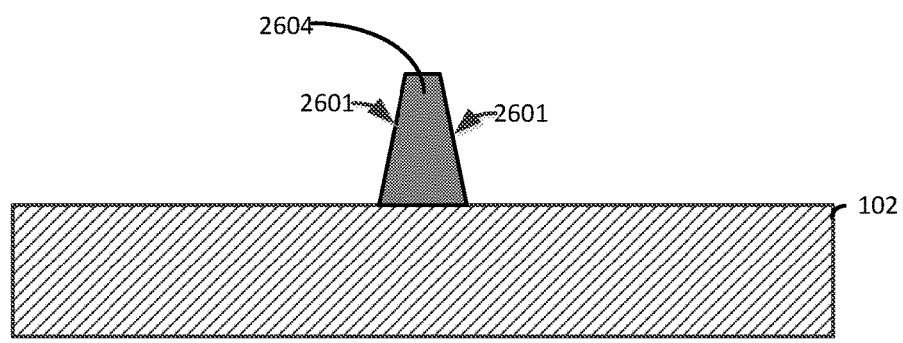
FIG. 28B illustrates a cut-away view along the line B-B (of FIG. 28C)
Figure 28C:
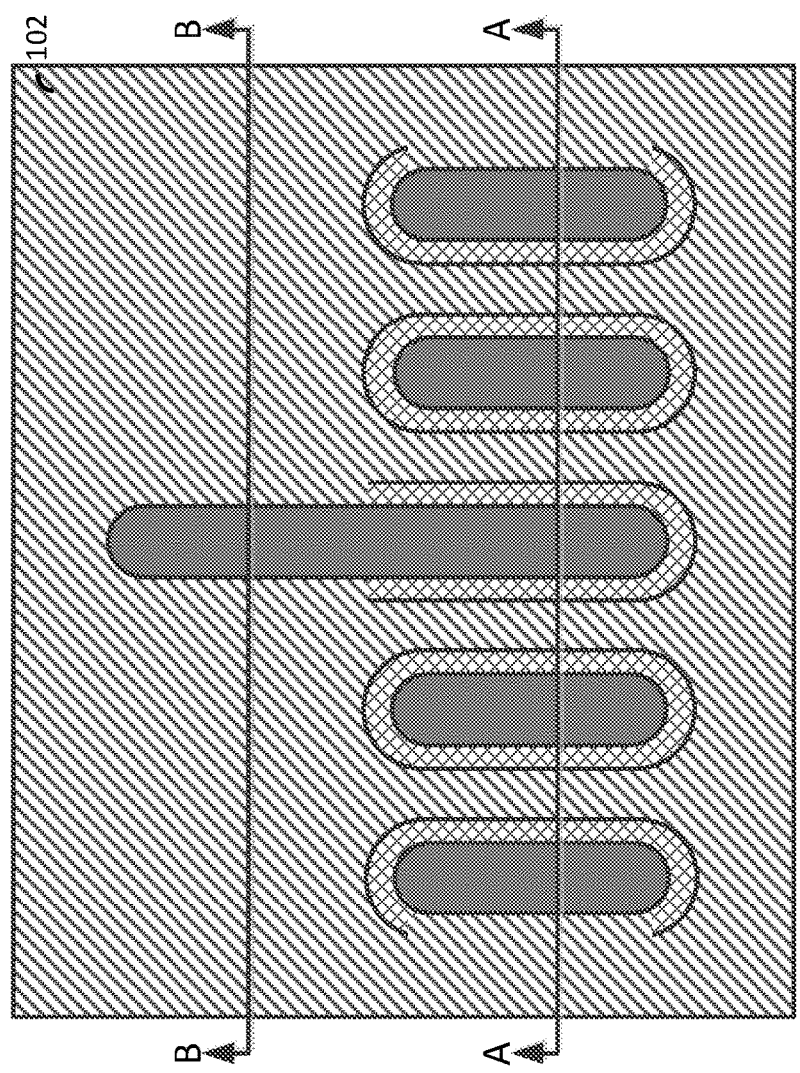
FIG. 28C illustrates a top view following the removal of portions of the layer of spacer material (of FIG. 27A) to form spacers.

FIG. 28A illustrates a cut-away view along the line A-A (of FIG. 28C), FIG. 28B illustrates a cut-away view along the line B-B (of FIG. 28C), and FIG. 28C illustrates a top view following the removal of portions of the layer of spacer material 302 (of FIG. 27A) to form spacers 402. The spacers 402 are not formed on the oblique surfaces 2601 when the spacers 402 are formed using a directional etching process such as, for example, reactive ion etching.

Figure 29:
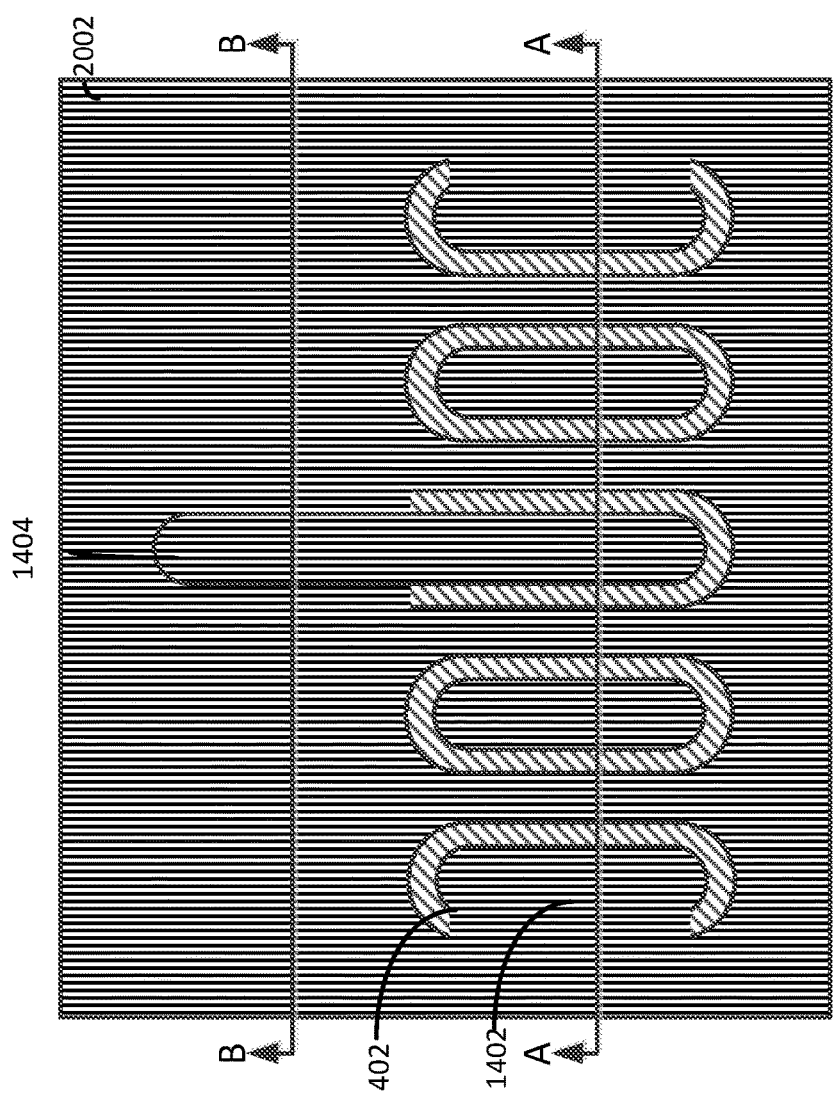

FIG. 29 illustrates a top view following similar processing methods as described above in FIGS. 8A-12C.

The methods described above in FIGS. 25-29 provide for forming mandrel and non-mandrel conductive lines using a single spacer.

Figure 30A:
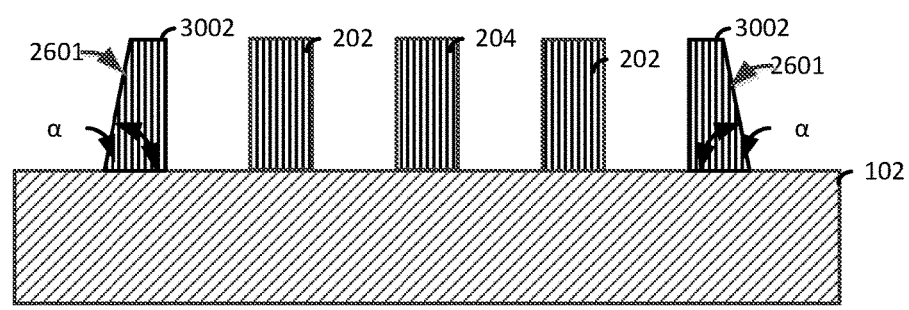
FIG. 30A illustrates a cut-away view along the line A-A (of FIG. 30C)
Figure 30B:
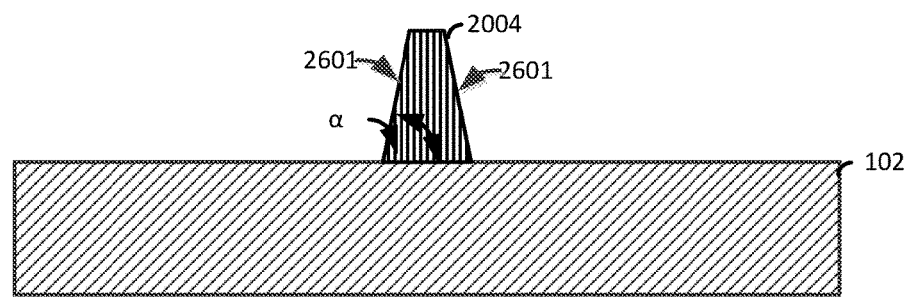
FIG. 30B illustrates a cut-away view along the line B-B (of FIG. 30C)
Figure 30C:
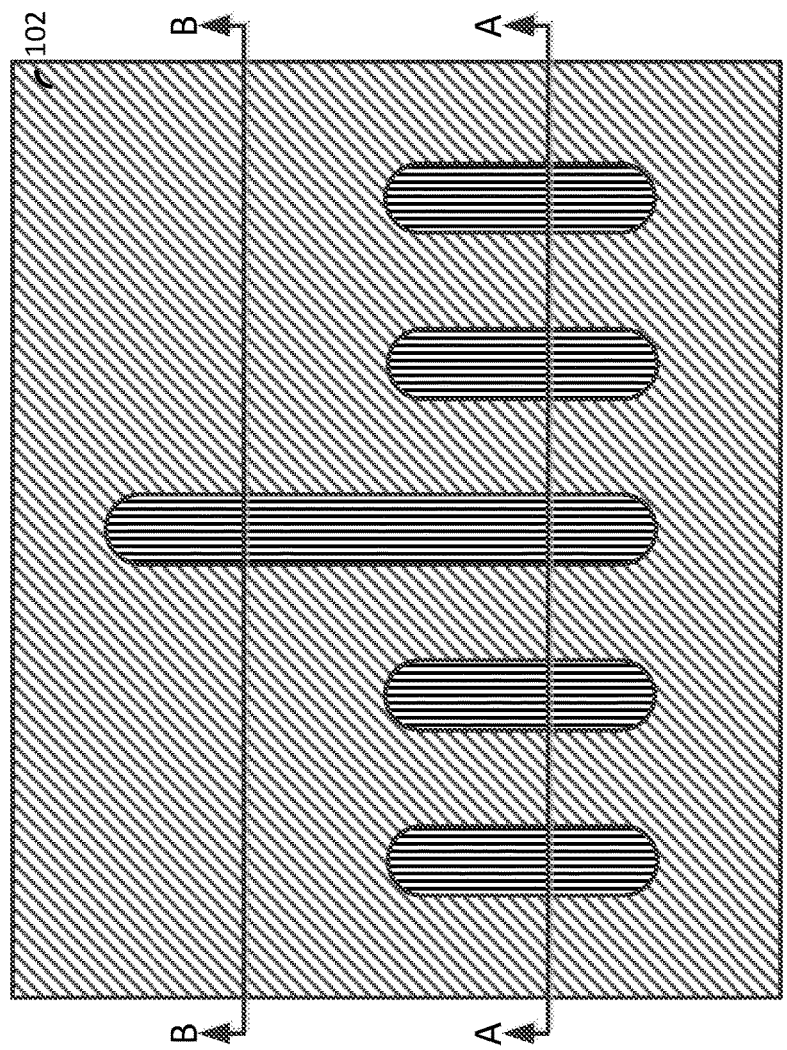
FIG. 30C illustrates a top view following the formation of mandrels.

FIG. 30A illustrates a cut-away view along the line A-A (of FIG. 30C), FIG. 30B illustrates a cut-away view along the line B-B (of FIG. 30C), and FIG. 30C illustrates a top view following the formation of mandrels 202, 204, and 3002 using a similar process as described above in FIGS. 26A-26C however, the mandrels 202 and 204 are formed from a layer of conductive material 1302 as described above in FIG. 13A. The mandrels 3002 have sloped outwardly facing sidewalls 2601 that are arranged at an oblique angle to the substrate 102.

Following the patterning of the mandrels 202, 204, and 3002, the methods similar to the methods described above can be used to form mandrel and non-mandrel conductive lines.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming conductive lines on a substrate, the method comprising:
   depositing a layer of mandrel material on a substrate;
   removing portions of the layer of mandrel material to form a first mandrel having a first length and a second mandrel having a second length, the first length is greater than the second length;
   forming a first spacer with a first spacer material along sidewalls of the first mandrel and the second mandrel, the first spacer defining a gap between the first mandrel and the second mandrel;
   depositing a layer of a second spacer material over the first spacer, the substrate, the gap, and the first mandrel and the second mandrel;
   removing portions of the second spacer material to expose portions of the first mandrel, the second mandrel, and the first spacer, and form a second spacer in the gap;
   removing the first mandrel and the second mandrel to expose portions of the substrate;
   removing exposed portions of the substrate to form cavities;
   removing the first spacer and the second spacer; and
   filling the cavities with a conductive material.

2. The method of claim 1, further comprising removing portions of the conductive material to form conductive lines in the cavities.

3. The method of claim 2, wherein the removing portions of the conductive material includes a planarization process.

4. The method of claim 1, wherein the layer of mandrel material includes an amorphous semiconductor material.

5. The method of claim 1, wherein the first spacer material includes a nitride material and the second spacer material includes an oxide material.

6. The method of claim 1, wherein the forming the first spacer includes:
   depositing the first spacer material over the first mandrel, the second mandrel, and the substrate; and
   removing portions of the first spacer material.

7. The method of claim 1, wherein the substrate includes an insulator material.

8. A method for forming conductive lines on a substrate, the method comprising:
   depositing a layer of mandrel material on a substrate;
   removing portions of the layer of mandrel material to form a first mandrel having a first length, a portion of the first mandrel has sloped sidewalls, a second mandrel having a second length, the second mandrel having an outwardly facing sloped sidewall, and a third mandrel having the second length, the third mandrel having an outwardly facing sloped sidewall, the first length is greater than the second length, the first mandrel is arranged between the second mandrel and the third mandrel
   forming a spacer along non-sloped sidewalls of the first mandrel, the second mandrel, and the third mandrel;
   removing the first mandrel, the second mandrel, and the third, mandrel;
   removing exposed portions of the substrate to form cavities; and
   filling the cavities with a conductive material.

9. The method of claim 8, further comprising removing portions of the conductive material to form conductive lines in the cavities.

10. The method of claim 9, wherein the removing portions of the conductive material includes a planarization process.

11. The method of claim 8, wherein the layer of mandrel material includes an amorphous semiconductor material.

12. The method of claim 8, wherein the first spacer material includes a nitride material and the second spacer material includes an oxide material.

13. The method of claim 8, wherein the forming the first spacer includes:
    depositing the first spacer material over the first mandrel, the second mandrel, and the substrate; and
    removing portions of the first spacer material.

14. The method of claim 8, wherein the substrate includes an insulator material.

15. A method for forming conductive lines on a substrate, the method comprising:
depositing a layer of conductive material on a substrate;
removing portions of the layer of conductive material to form a first mandrel having a first length and a second mandrel having a second length, the first length is greater than the second length;
forming a first spacer with a first spacer material along sidewalls of the first mandrel and the second mandrel, the first spacer defining a gap between the first mandrel and the second mandrel;
depositing a layer of a second spacer material over the first spacer, the substrate, the gap, and the first mandrel and the second mandrel;
removing portions of the second spacer material to expose portions of the first mandrel, the second mandrel, and the first spacer, and form a second spacer in the gap;
depositing a second layer of conductive material over the substrate;
removing portions of the second layer of conductive material to expose portions of the first spacer and the second spacer;
removing the first spacer and the second spacer to expose portions of the substrate; and
depositing a fill material on exposed portions of the substrate.

16. The method of claim 15, wherein the layer of mandrel material includes an amorphous semiconductor material.

17. The method of claim 15, wherein the first spacer material includes a nitride material and the second spacer material includes an oxide material.

18. The method of claim 15, wherein the fill material includes a semiconductor material.

19. The method of claim 15, wherein the fill material includes an insulator material.

20. The method of claim 15, wherein the layer of conductive material is similar to the second layer of conductive material.

* * * * *